(12) United States Patent
Liu et al.

(10) Patent No.: US 12,336,237 B2
(45) Date of Patent: Jun. 17, 2025

(54) SOURCE/DRAIN REGIONS OF SEMICONDUCTOR DEVICE AND METHOD OF FORMING THE SAME

(71) Applicant: Taiwan Semiconductor Manufacturing Co., Ltd., Hsinchu (TW)

(72) Inventors: Wei-Min Liu, Hsinchu (TW); Li-Li Su, Chubei (TW); Chii-Horng Li, Zhubei (TW); Yee-Chia Yeo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 537 days.

(21) Appl. No.: 17/644,140

(22) Filed: Dec. 14, 2021

(65) Prior Publication Data

US 2022/0359653 A1   Nov. 10, 2022

Related U.S. Application Data

(60) Provisional application No. 63/184,515, filed on May 5, 2021.

(51) Int. Cl.
*H10D 62/10* (2025.01)
*H10D 30/67* (2025.01)
(Continued)

(52) U.S. Cl.
CPC ....... *H10D 62/118* (2025.01); *H10D 30/6713* (2025.01); *H10D 30/6735* (2025.01);
(Continued)

(58) Field of Classification Search
CPC ....... H01L 29/0665–0673; H01L 29/161–165; H01L 29/66795–66818; H01L 29/78696;
(Continued)

(56) References Cited

U.S. PATENT DOCUMENTS 9,209,247 B2   12/2015   Colinge et al.
9,236,267 B2   1/2016    De et al.
(Continued)

FOREIGN PATENT DOCUMENTS

TW    202036904 A    10/2020
TW    202115901 A    4/2021

*Primary Examiner* — Amar Movva
*Assistant Examiner* — Eric Manuel Mulero Flores
(74) *Attorney, Agent, or Firm* — Slater Matsil, LLP

(57) ABSTRACT

A device includes a first nanostructure over a semiconductor substrate; a second nanostructure over the first nanostructure; a gate structure surrounding the first nanostructure and the second nanostructure; a first epitaxial region in the semiconductor substrate adjacent the gate structure, wherein the first epitaxial region is a first doped semiconductor material; and a second epitaxial region over the first epitaxial region, wherein the second epitaxial region is adjacent the first nanostructure and the second nanostructure, wherein the second epitaxial region is a second doped semiconductor material that is different from the first doped semiconductor material. In an embodiment, the first doped semiconductor material has a smaller doping concentration than the second doped semiconductor material.

20 Claims, 37 Drawing Sheets

(51) Int. Cl.
*H10D 84/01* (2025.01)
*H10D 84/03* (2025.01)

(52) U.S. Cl.
CPC ..... *H10D 30/6757* (2025.01); *H10D 84/0128* (2025.01); *H10D 84/013* (2025.01); *H10D 84/038* (2025.01)

(58) Field of Classification Search
CPC ... H01L 29/0843–0886; H01L 29/7842–7849; H01L 29/785–7856; H01L 29/66545; H01L 29/42392; H01L 2029/7857–7858; H01L 21/8234–823437; H01L 21/8238–823821; H10D 62/117–123; H10D 30/62–6219; H10D 30/6713–6721; H10D 30/6735–6736; H10D 64/251–2527; H10D 64/258–259
See application file for complete search history.

(56) References Cited

U.S. PATENT DOCUMENTS

| | | | |
|---|---|---|---|
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 2014/0225168 A1* | 8/2014 | Pham | H01L 29/7846 257/288 |
| 2015/0303118 A1* | 10/2015 | Wang | H01L 21/823481 257/401 |
| 2019/0097006 A1* | 3/2019 | Li | H01L 29/66795 |
| 2019/0237572 A1* | 8/2019 | Ching | H01L 29/66795 |
| 2020/0020771 A1* | 1/2020 | Chen | H01L 29/7848 |
| 2020/0220018 A1* | 7/2020 | Jang | H02K 15/027 |
| 2021/0104616 A1 | 4/2021 | Su et al. | |
| 2021/0126106 A1 | 4/2021 | Wang et al. | |
| 2021/0126135 A1 | 4/2021 | Lee et al. | |
| 2021/0257499 A1* | 8/2021 | Shin | H01L 29/42376 |
| 2021/0343859 A1 | 11/2021 | Son et al. | |

\* cited by examiner

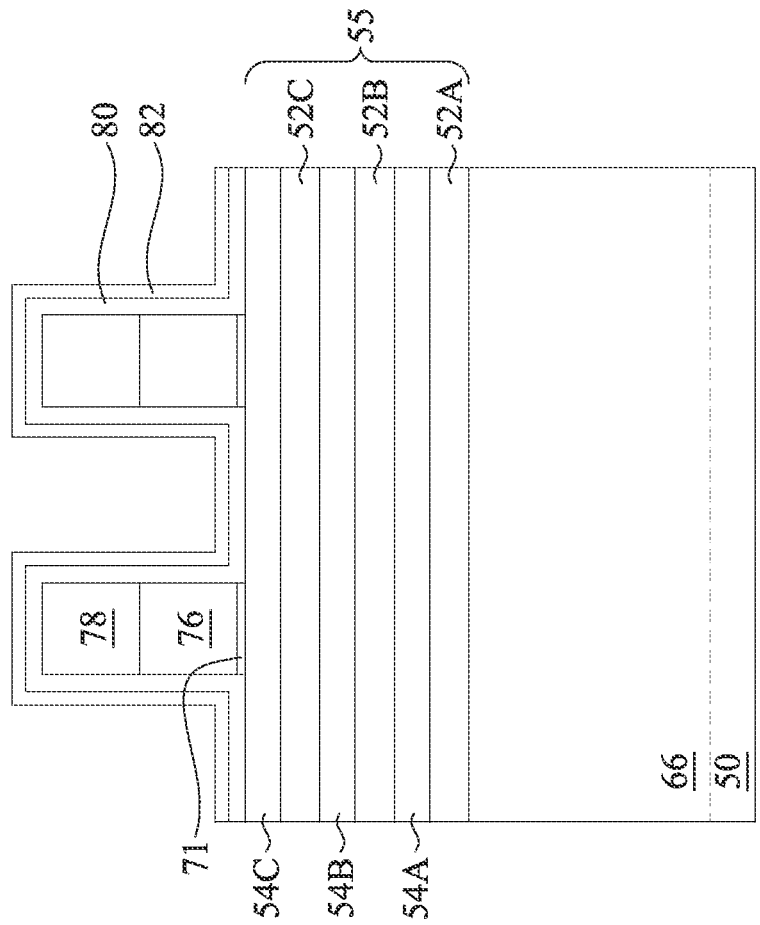
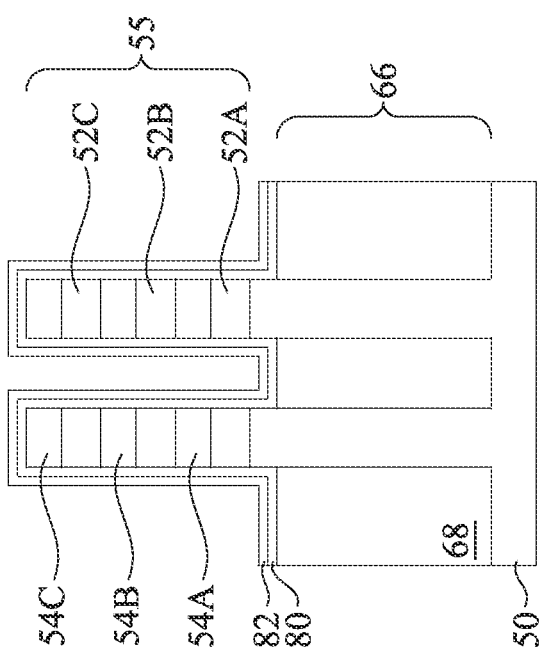
Fig. 7B
Fig. 7A

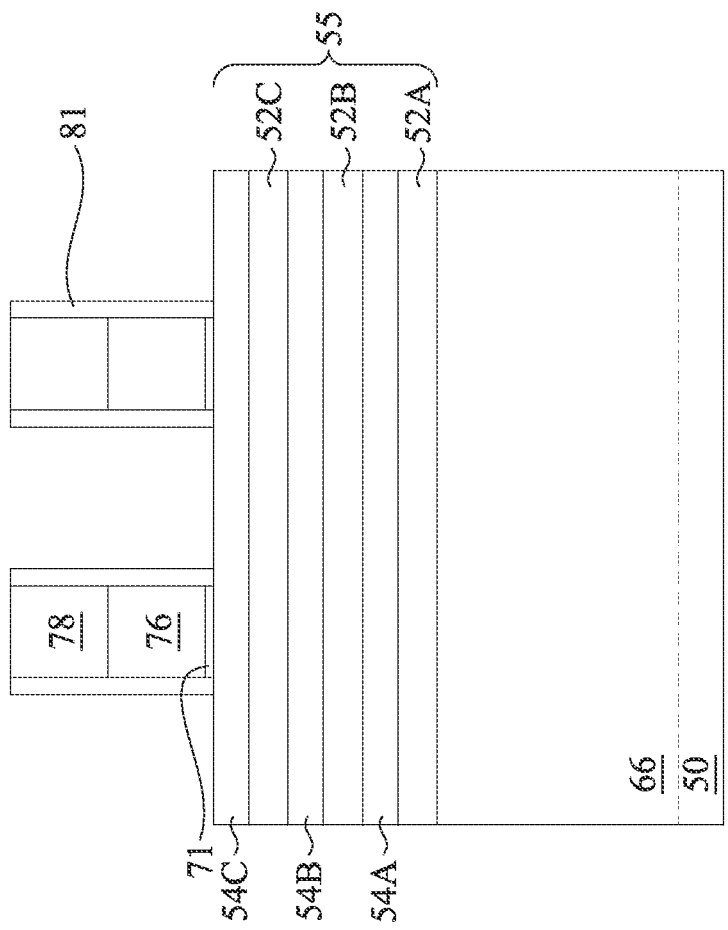
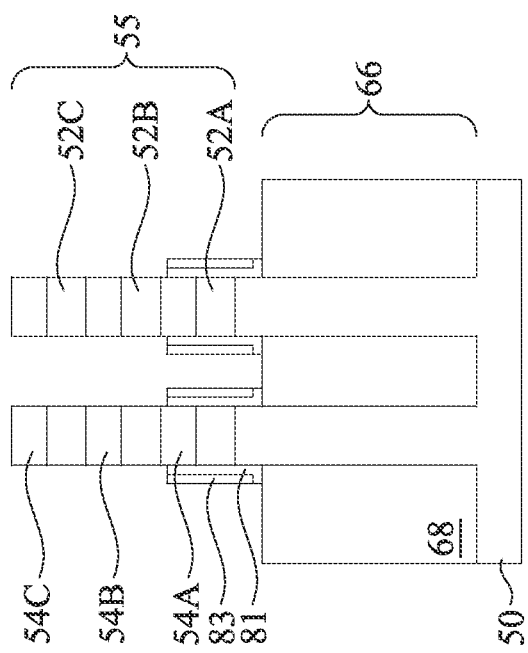
Fig. 8B
Fig. 8A

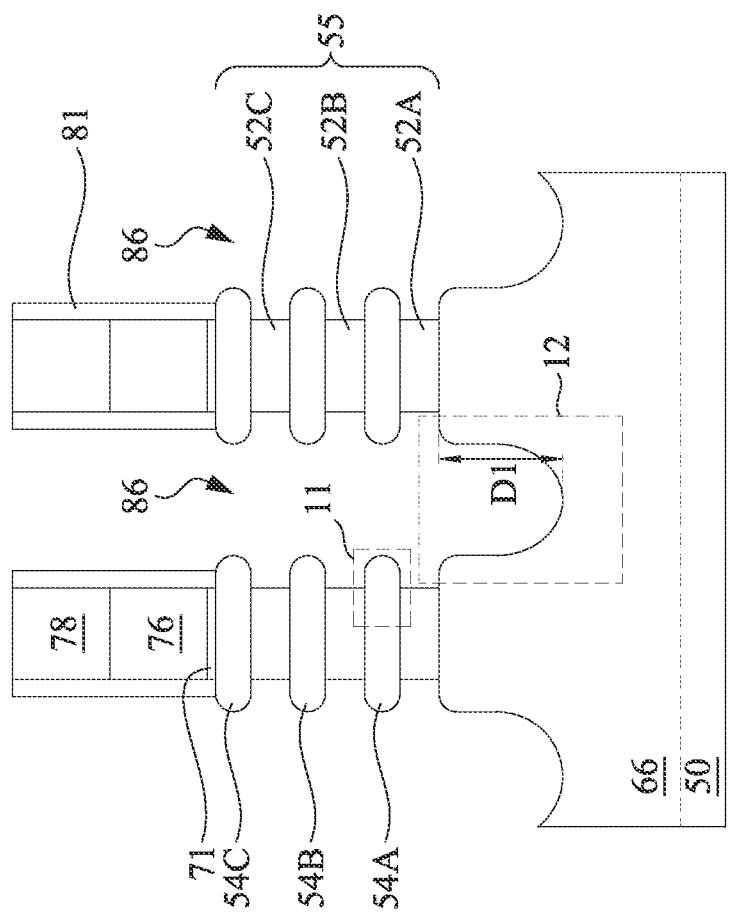
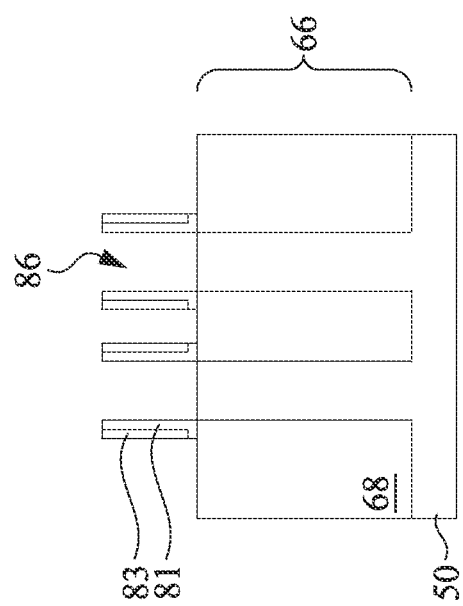
Fig. 10A
Fig. 10B

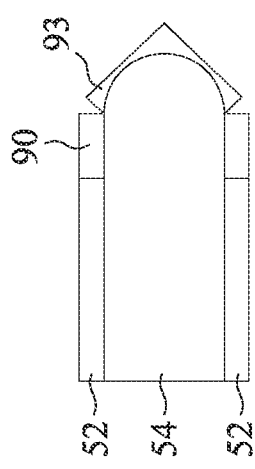
Fig. 15A
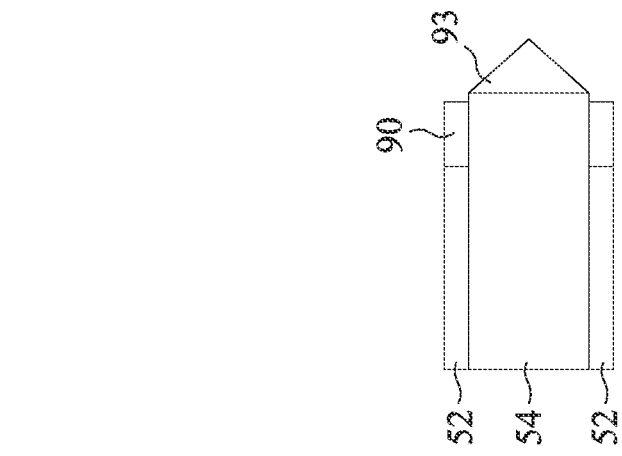
Fig. 15B
Fig. 15C
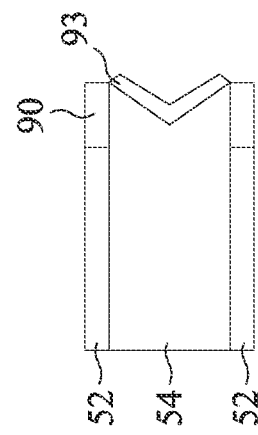
Fig. 15E
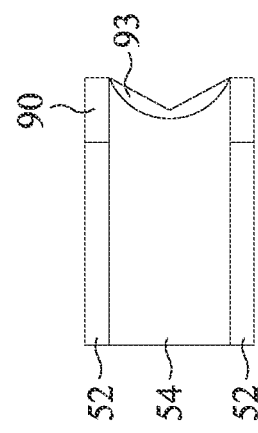
Fig. 15D

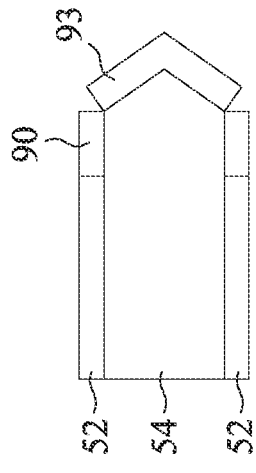
Fig. 16B
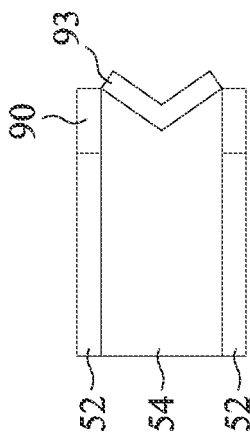
Fig. 16E
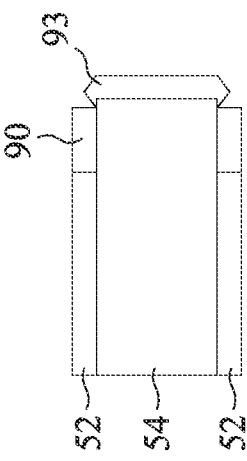
Fig. 16C
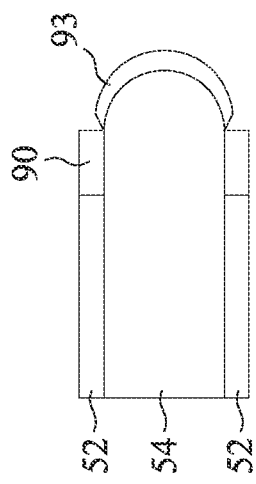
Fig. 16A
Fig. 16D

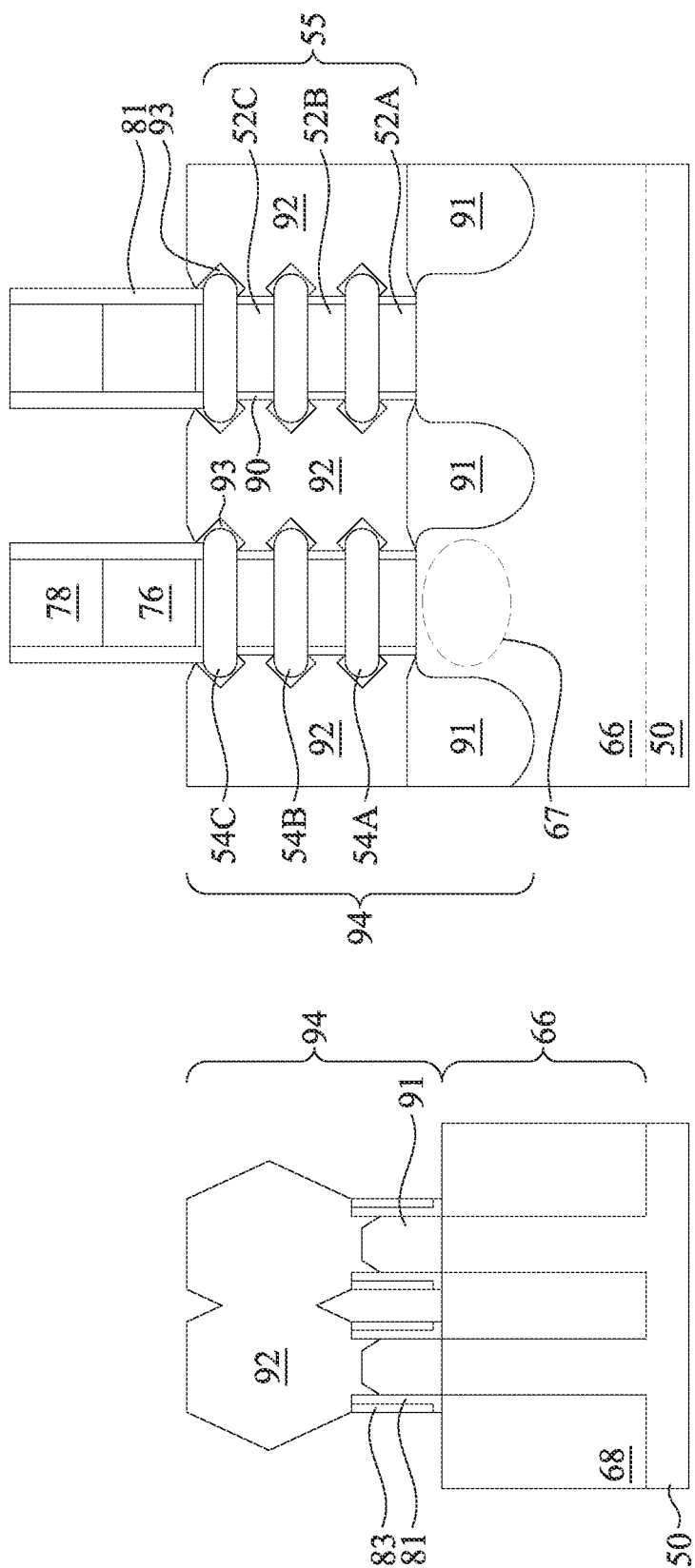

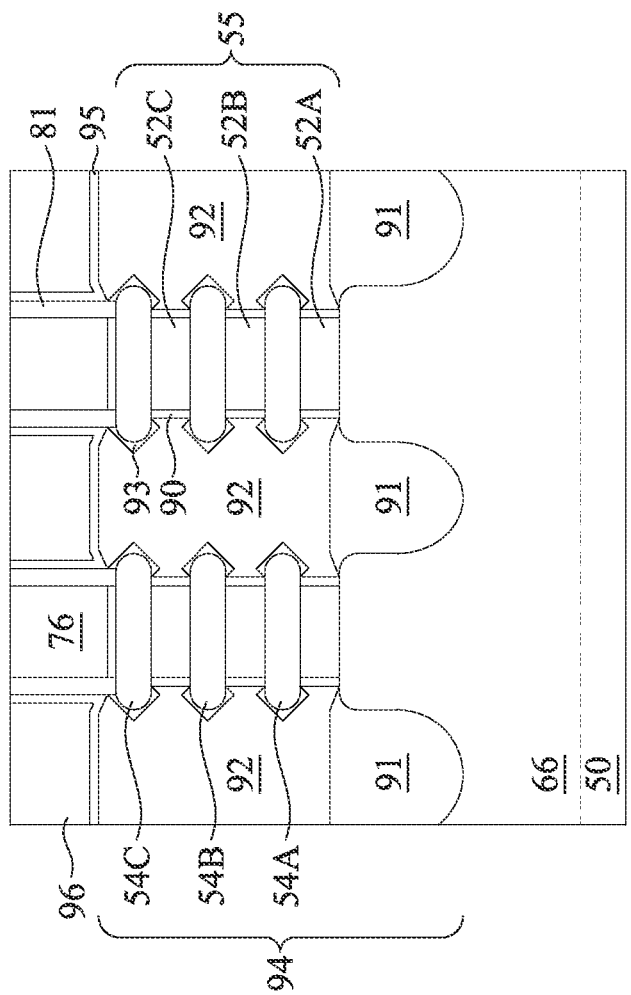
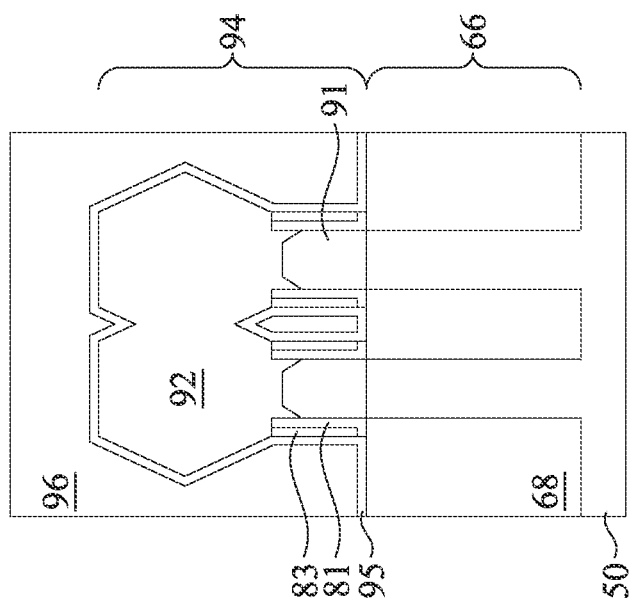
Fig. 19B
Fig. 19A

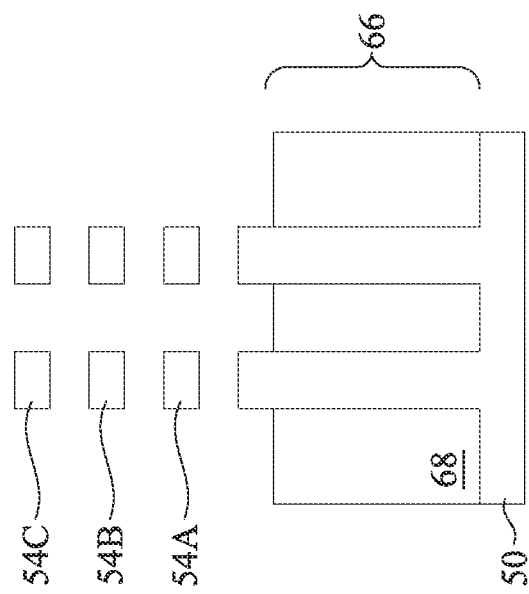

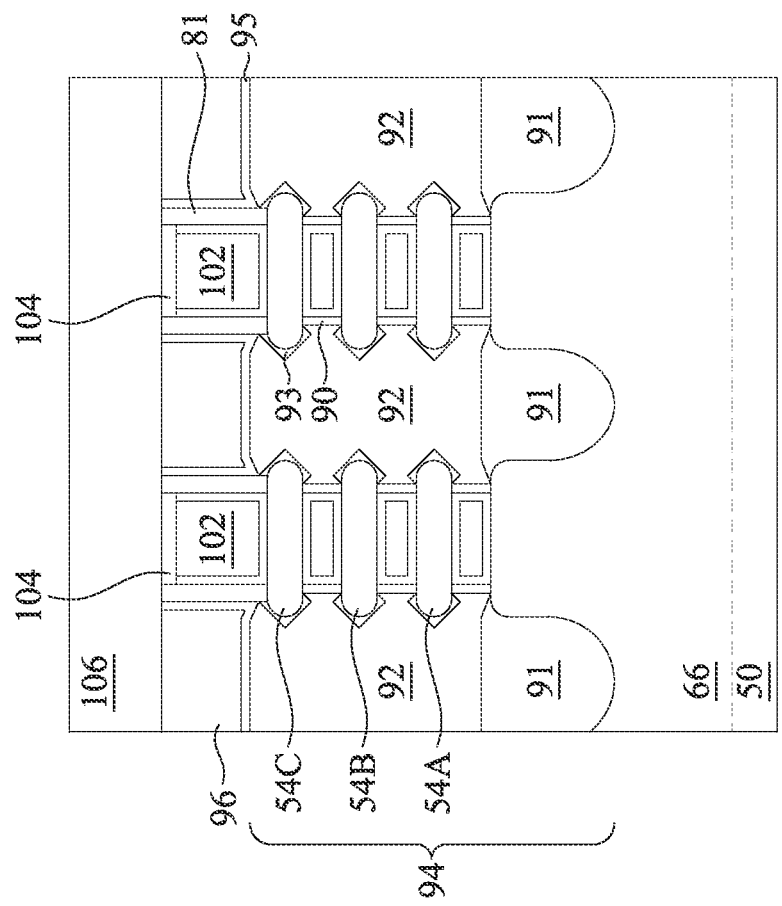
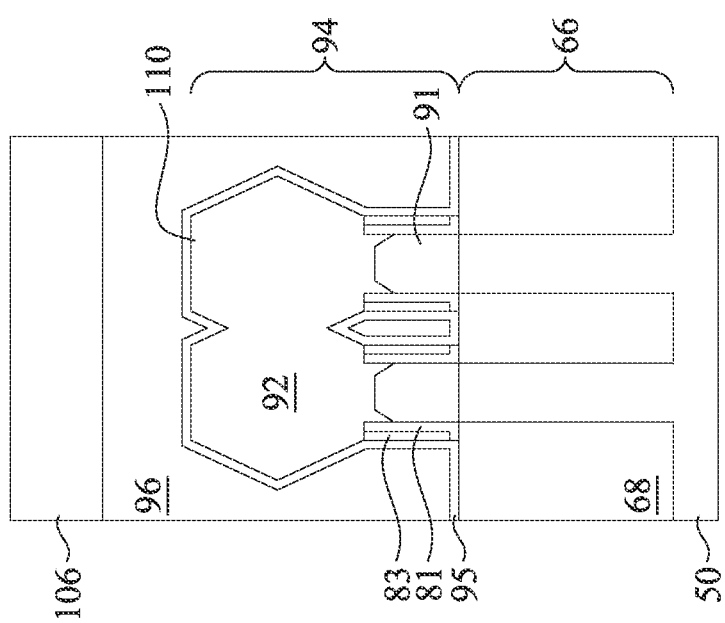
Fig. 23A
Fig. 23B

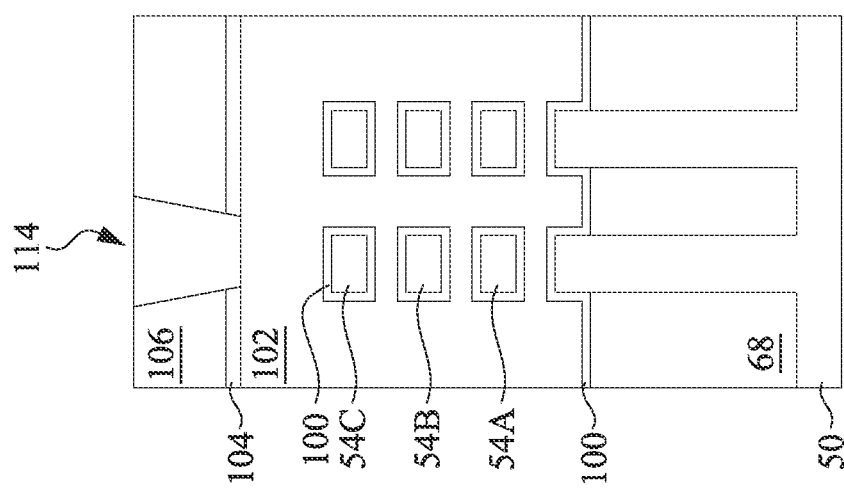

SOURCE/DRAIN REGIONS OF SEMICONDUCTOR DEVICE AND METHOD OF FORMING THE SAME

PRIORITY CLAIM AND CROSS-REFERENCE

This application claims the benefit of U.S. Provisional Application No. 63/184,515 filed on May 5, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6A, 6B, 6C, 7A, 7B, 8A, 8B, 9A, 9B, 10A, 10B, 11A, 11B, 11C, 11D, 11E, 12A, 12B, 12C, 13A, 13B, 13C, 14A, 14B, 14C, 15A, 15B, 15C, 15D, 15E, 16A, 16B, 16C, 16D, 16E, 17A, 17B, 17C, 18A, 18B, 18C, 19A, 19B, 19C, 20A, 20B, 20C, 21A, 21B, 21C, 22A, 22B, 22C, 23A, 23B, 23C, 24A, 24B, and 24C are cross-sectional views of intermediate stages in the manufacturing of nano-FETs, in accordance with some embodiments.

FIGS. 25A, 25B, and 25C are cross-sectional views of a nano-FET device, in accordance with some embodiments.

DETAILED DESCRIPTION

Figure 1:
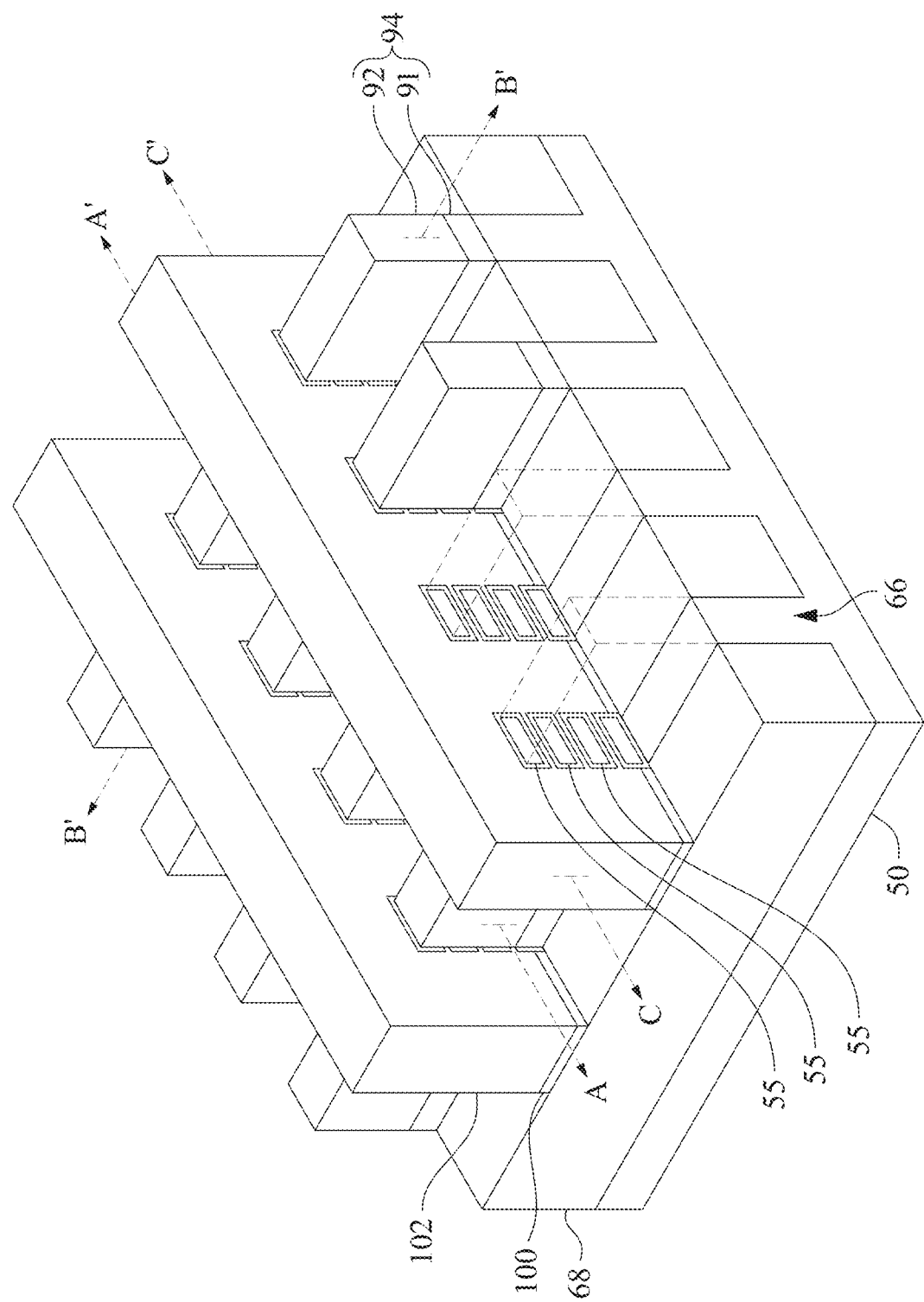
FIG. 1 illustrates an example of a nanostructure field-effect transistor (nano-FET) device in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments describe the formation of a p-type nano-FET structure with source/drain regions having multiple epitaxial regions. For example, the source/drain region may include a first epitaxial region formed in a recess and a second epitaxial region formed over the first epitaxial region. The first epitaxial region and the second epitaxial region may have different compositions and/or doping concentrations. For example, a first epitaxial region may be formed that has a lower doping concentration than the second epitaxial region, an opposite polarity of doping from the second epitaxial region, or a different composition of semiconductor material than the second epitaxial region. Other differences are possible. In some cases, the composition and/or doping concentration of the first epitaxial region may be controlled to reduce leakage and improve device performance.

Embodiments are described below in a particular context, a die comprising nano-FETs. Various embodiments or aspects thereof may be applied, however, to dies comprising other types of transistors (e.g., fin field-effect transistors (FinFETs), planar transistors, or the like) in lieu of or in combination with the nano-FETs. Some embodiments discussed herein are discussed in the context of nano-FETs formed using a gate-last process. In other embodiments, a gate-first process may be used. Also, some embodiments contemplate aspects used in planar devices, such as planar FETs, or in fin field-effect transistors (FinFETs). For example, FinFETs may include fins on a substrate, with the fins acting as channel regions for the FinFETs. Similarly, planar FETs may include a substrate, with portions of the substrate acting as channel regions for the planar FETs.

FIG. 1 illustrates an example of nano-FETs (e.g., nanowire FETs, nanosheet FETs (nano-FETs), or the like) in a three-dimensional view, in accordance with some embodiments. Some features of the nano-FETs shown in FIG. 1 are omitted for clarity. The nano-FETs may be nanosheet field-effect transistors (NSFETs), nanowire field-effect transistors (NWFETs), gate-all-around field-effect transistors (GAAFETs), or the like. The nano-FETs shown in FIG. 1 comprise nanostructures 55 (e.g., nanosheets, nanowires, or the like) over fins 66 on a substrate 50 (e.g., a semiconductor substrate), wherein the nanostructures 55 act as channel regions for the nano-FETs. The nanostructures 55 may include p-type nanostructures, n-type nanostructures, or a combination thereof. Isolation regions 68 (e.g., STI regions) are disposed between adjacent fins 66, which may protrude above and from between neighboring isolation regions 68. Although the isolation regions 68 are described/illustrated as being separate from the substrate 50, as used herein, the term "substrate" may refer to the semiconductor substrate alone or a combination of the semiconductor substrate and the isolation regions. Additionally, although a bottom portion of the fins 66 are illustrated as being single, continuous materials with the substrate 50, the bottom portion of the fins 66 and/or the substrate 50 may comprise a single material or a plurality of materials. In this context, the fins 66 refer to the portions extending between the neighboring isolation regions 68.

Gate dielectric layers 100 are over top surfaces of the fins 66 and along top surfaces, sidewalls, and bottom surfaces of the nanostructures 55. In this manner, the gate dielectric layers 100 may surround portions of the nanostructures 55. Gate electrodes 102 are over the gate dielectric layers 100 and surround portions of the gate dielectric layers 100. Epitaxial source/drain regions 94 are disposed on the fins 66 on opposing bottom surfaces of sides of the gate dielectric layers 100 and the gate electrodes 102. In some embodiments, the epitaxial source/drain regions 94 comprise a second epitaxial region 92 over a first epitaxial region 91.

FIG. 1 further illustrates reference cross-sections that are used in some later figures. Cross-section A-A' extends through epitaxial source/drain regions 94 of the nano-FETs and in a direction, for example, perpendicular to the direction of current flow between the epitaxial source/drain regions 94 of a nano-FET. Cross-section B-B' extends through epitaxial source/drain regions 94 of the nano-FETs and in a direction, for example, parallel to the direction of current flow between the epitaxial source/drain regions 94 of a nano-FET. In this manner, cross-section B-B' is perpendicular to cross-section A-A' and is parallel to a longitudinal axis of a fin 66 of a nano-FET. Cross-section C-C' is parallel to cross-section A-A' and extends along a longitudinal axis of a gate electrode 102. Subsequent figures refer to these reference cross-sections for clarity.

FIGS. 2 through 25C illustrate various cross-sectional views of intermediate stages in the manufacturing of a nano-FET device, in accordance with some embodiments. FIGS. 2, 3, 4, 5, 6A, 7A, 8A, 9A, 10A, 13A, 14A, 17A, 17C, 18A, 19A, 20A, 21A, 22A, 23A, 24A, and 25A illustrate cross-sectional views along the reference cross-section A-A' illustrated in FIG. 1. FIGS. 6B, 7B, 8B, 9B, 10B, 11A, 11B, 11C, 11D, 11E, 12A, 12B, 12C, 13B, 13C, 14B, 14C, 15A, 15B, 15C, 15D, 15E, 16A, 16B, 16C, 16D, 16E, 17B, 18B, 19B, 20B, 21B, 22B, 23B, 24B, and 25B illustrate cross-sectional views along the reference cross-section B-B' illustrated in FIG. 1. FIGS. 18C, 19C, 20C, 21C, 22C, 23C, 24C, and 25C illustrate cross-sectional views along the reference cross-section C-C' illustrated in FIG. 1.

Figure 2:
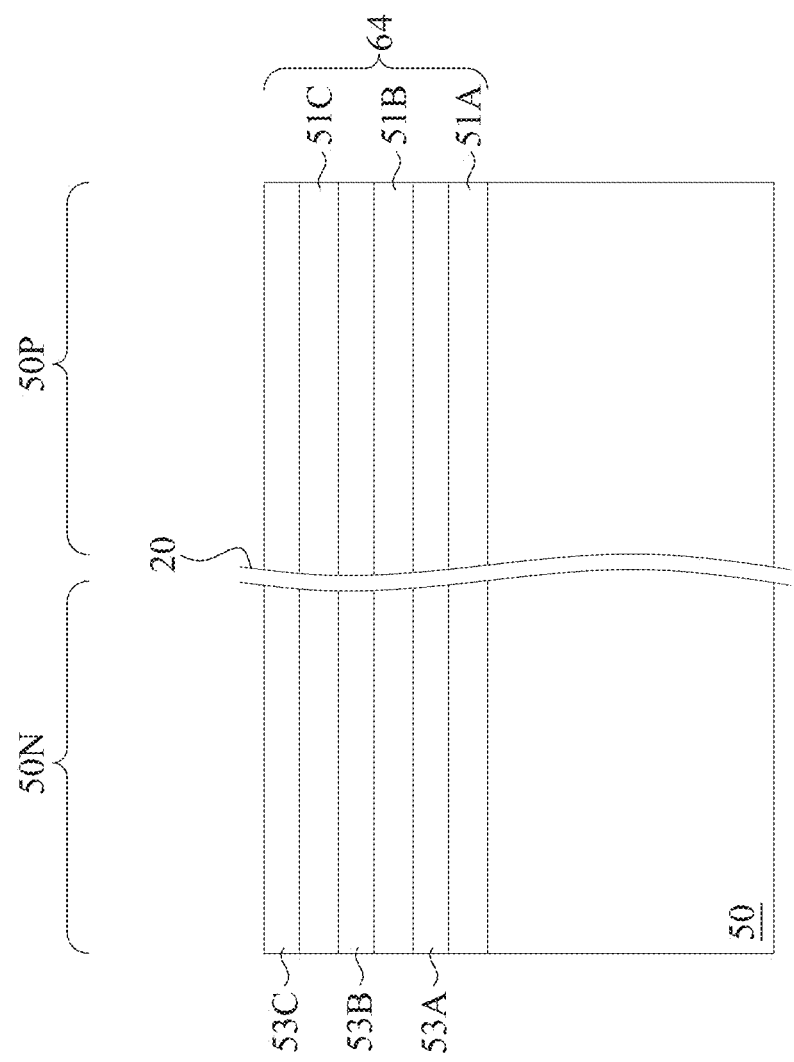

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon substrate or a glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (as illustrated by divider 20), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

Further in FIG. 2, a multi-layer stack 64 is formed over the substrate 50. The multi-layer stack 64 includes alternating layers of first semiconductor layers 51A-C (collectively referred to as first semiconductor layers 51) and second semiconductor layers 53A-C (collectively referred to as second semiconductor layers 53). The first semiconductor layers 51 are formed of a first semiconductor material, and the second semiconductor layers 53 are formed of a second semiconductor material, each of which may be selected from the candidate semiconductor materials of the substrate 50, for example.

In the illustrated embodiment, and as will be subsequently described in greater detail, the first semiconductor layers 51 are removed and the second semiconductor layers 53 are patterned to form channel regions for the nano-FETs in the p-type region 50P. In this manner, the first semiconductor layers 51 may be considered sacrificial layers (or dummy layers) which are removed in subsequent processing to expose surfaces of the second semiconductor layers 53. Accordingly, the first semiconductor material of the first semiconductor layers 51 may be a material that has a high etching selectivity over the second semiconductor material of the second semiconductor layers 53. For example, in some embodiments, the first semiconductor material may be silicon germanium or the like, and the second semiconductor material may be silicon or the like. Other materials are possible. In some embodiments, the second semiconductor material is a material suitable for both n-type and p-type devices, such as silicon. Though not illustrated, the same process steps may be used to remove the first semiconductor layers 51 and pattern the second semiconductor layers 53 to form channel regions for the nano-FETs in the n-type region 50N, in some embodiments.

The multi-layer stack 64 is illustrated as including three layers of each of the first semiconductor layers 51 and the second semiconductor layers 53 for illustrative purposes. In some embodiments, the multi-layer stack 64 may include any number of the first semiconductor layers 51 and the second semiconductor layers 53. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. In some embodiments, each of the layers of the multi-layer stack 64 may have a thickness in the range of about 5 nm to about 30 nm, though other thicknesses are possible. In some embodiments, some layers of the multi-layer stack 64 (e.g., the first semiconductor layers 51) are formed to be thinner than other layers of the multi-layer stack 64 (e.g., the second semiconductor layers 53). In other embodiments, the layers of the multi-layer stack 64 have approximately the same thickness.

Figure 3:
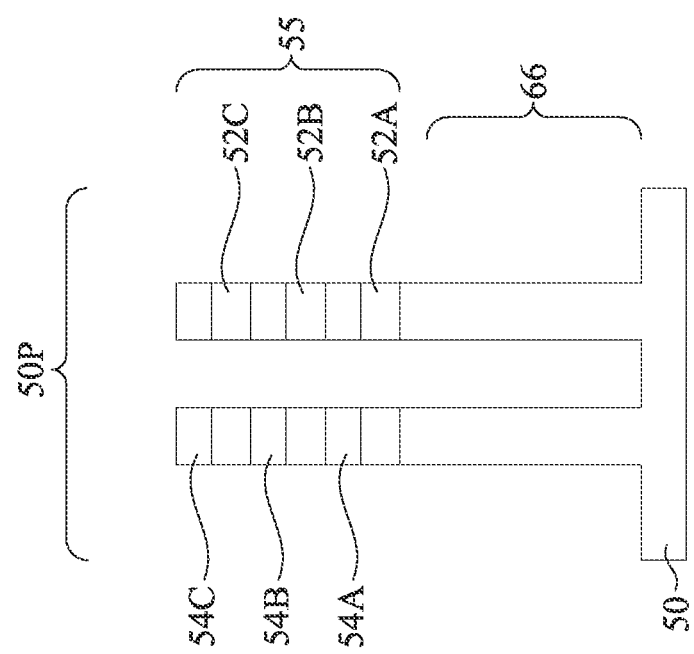

FIGS. 3-25C illustrate various intermediate steps in the manufacturing of nano-FETs in the p-type region 50P, in accordance with some embodiments. However, some of aspects of the described embodiments may also be applicable to the manufacturing of nano-FETs in the n-type region 50N. In FIG. 3, fins 66 are patterned in the substrate 50 and nanostructures 55 are patterned in the multi-layer stack 64, in accordance with some embodiments. In some embodiments, the nanostructures 55 and the fins 66 may be patterned, for example, by etching trenches in the multi-layer stack 64 and the substrate 50. The fins 66 are semiconductor strips patterned in the substrate 50. As shown in FIG. 3, the etching of the multi-layer stack 64 defines first nanostructures 52A-C (collectively referred to as the first nanostructures 52) from the first semiconductor layers 51 and defines second nanostructures 54A-C (collectively referred to as the second nanostructures 54) from the second semiconductor layers 53. In this manner, the nanostructures 55 include first nanostructures 52 formed from remaining portions of the first semiconductor layers 51 and second nanostructures 54 formed from remaining portions of the second semiconductor layers 53. The etching may be performed using any acceptable etch process, such as a reactive ion etch (RIE), neutral beam etch (NBE), the like, or a combination thereof. The etching may be anisotropic.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used as masks to pattern the fins 66 and the nanostructures 55. In some embodiments, the masks may remain on the nanostructures 55.

FIG. 3 illustrates the fins 66 as having substantially vertical sidewalls for illustrative purposes. In some embodiments, the fins 66 and/or the nanostructures 55 may have tapered sidewalls such that a width of each of the fins 66 and/or the nanostructures 55 continuously increases in a direction towards the substrate 50. In such embodiments, the nanostructures 55 may have different widths and be trapezoidal in shape. In some embodiments, the fins 66 and the nanostructures 55 may each have widths in the range of about 8 nm to about 40 nm, though other widths are possible.

Figure 4:
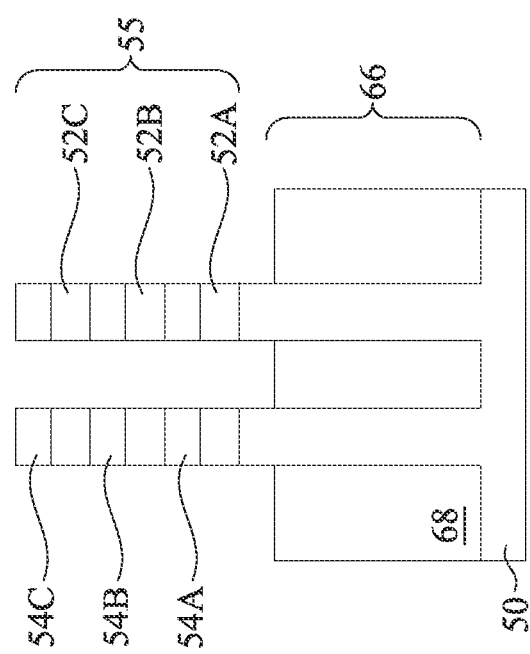

In FIG. 4, shallow trench isolation (STI) regions 68 are formed over the substrate 50 and between adjacent fins 66. The STI regions 68 are disposed around at least a portion of the fins 66 such that at least a portion of the nanostructures 55 protrude from between adjacent STI regions 68. The top surfaces of the STI regions 68 may be above, approximately level with, or below the top surfaces of the fins 66. The STI regions 68 separate the features of adjacent devices.

The STI regions 68 may be formed, for example, by depositing an insulation material over the substrate 50, the fins 66, and the nanostructures 55, and between adjacent fins 66. The insulation material may be an oxide, such as silicon oxide, a nitride, the like, or a combination thereof, which may be formed by a chemical vapor deposition (CVD) process, such as high density plasma CVD (HDP-CVD), flowable chemical vapor deposition (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 55. Although the insulation material is illustrated as a single layer, some embodiments may utilize multiple layers. For example, in some embodiments a liner (not separately illustrated) may first be formed along a surface of the substrate 50, the fins 66, and the nanostructures 55. An insulation fill material, which may be similar to the insulation materials described above, may then be formed over the liner.

A removal process is then applied to the insulation material to remove excess insulation material over the nanostructures 55. In some embodiments, a planarization process such as a chemical mechanical polish (CMP), an etch-back process, the like, or a combination thereof may be utilized. The planarization process exposes the nanostructures 55 such that top surfaces of the nanostructures 55 and the insulation material are level after the planarization process is complete. In embodiments in which a mask remains on the nanostructures 55, the planarization process may expose the mask or remove the mask. After the planarization process, the top surfaces of the insulation material and the mask (if present) or the nanostructures 55 are coplanar (within process variations). Accordingly, the top surfaces of the mask (if present) or the nanostructures 55 are exposed through the insulation material. In the illustrated embodiment, no mask remains on the nanostructures 55.

The insulation material is then recessed to form the STI regions 68, in accordance with some embodiments. The insulation material is recessed such that upper portions of fins 66 protrude from between neighboring STI regions 68. The top surfaces of the STI regions 68 may have a flat surface (as illustrated), a convex surface, a concave surface (such as dishing), or a combination thereof. The top surfaces of the STI regions 68 may be formed as flat, convex, and/or concave by an appropriate etching process. The insulation material may be recessed using an acceptable etching process, such as one that is selective to the material of the insulation material (e.g., selectively etches the material of the insulation material over the material of the fins 66 and the nanostructures 55). For example, an oxide removal using, for example, dilute hydrofluoric (dHF) acid may be used.

The process described above with respect to FIGS. 2 through 4 is just one example of how the fins 66 and the nanostructures 55 may be formed. In some embodiments, the fins 66 and/or the nanostructures 55 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 66 and/or the nanostructures 55. The epitaxial structures may comprise the alternating semiconductor materials discussed above, such as the first semiconductor material and the second semiconductor material. In some embodiments in which epitaxial structures are epitaxially grown, the epitaxially grown materials may be in situ doped during growth, which may obviate prior and/or subsequent implantations, although in situ and implantation doping may be used together.

Further, appropriate wells (not separately illustrated) may be formed in the fins 66, the nanostructures 55, and/or the STI regions 68. The wells may be formed, for example, by doping (e.g., with p-type or n-type impurities). In some embodiments, the wells may have a conductivity type opposite from a conductivity type of source/drain regions that will be subsequently formed in each of the n-type region 50N and the p-type region 50P. In some embodiments, a p-type well or an n-type well is formed in both the n-type region 50N and the p-type region 50P. In some embodiments, a p-type well is formed in the n-type region 50N, and an n-type well is formed in the p-type region 50P. For example, n-type impurities may be implanted into the fins 66 of the p-type region 50P of FIG. 4. The n-type impurities may be phosphorus, arsenic, antimony, or the like implanted in the region to a concentration in the range of about $10^{13}$ atoms/cm$^3$ to about $10^{14}$ atoms/cm$^3$, though other concentrations are possible.

In embodiments with different well types, different implant steps for the n-type region 50N and the p-type region 50P may be achieved using a mask (not separately illustrated), such as a patterned photoresist. For example, a photoresist may be formed over the fins 66 and the STI regions 68 in the n-type region 50N and the p-type region 50P. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. After the implant, the photoresist is removed, such as by an acceptable ashing process. A similar technique may be used to implant the n-type region 50N with p-type impurities.

After the implants of the n-type region 50N and/or the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5:
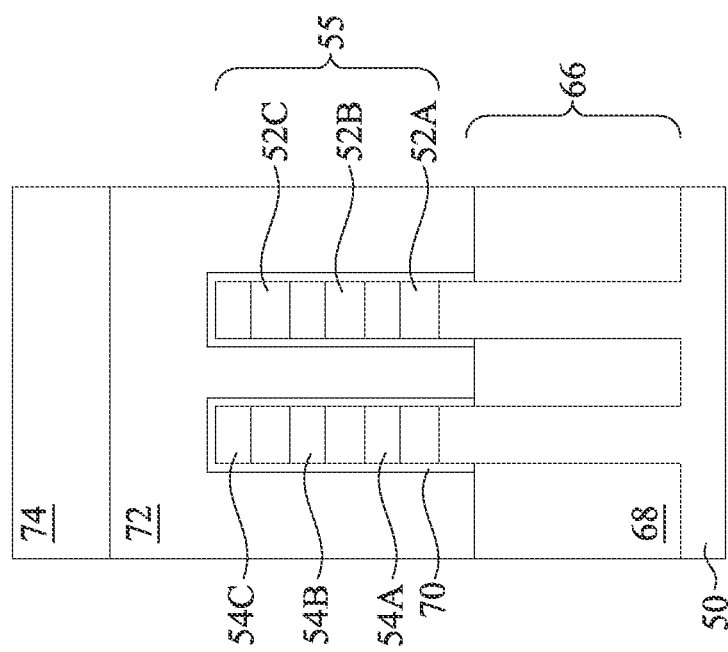

In FIG. 5, a dummy dielectric layer 70 is formed on the fins 66 and/or the nanostructures 55. The dummy dielectric layer 70 may comprise, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of isolation regions. The mask layer 74 may include, for example, silicon nitride, silicon oxynitride, or the like. In FIG. 5, the dummy dielectric layer 70 is shown covering only the fins 66 and the nanostructures 55, but in other embodiments the dummy dielectric layer 70 may also cover the STI regions 68 and extend between the fins 66.

Figure 6B:
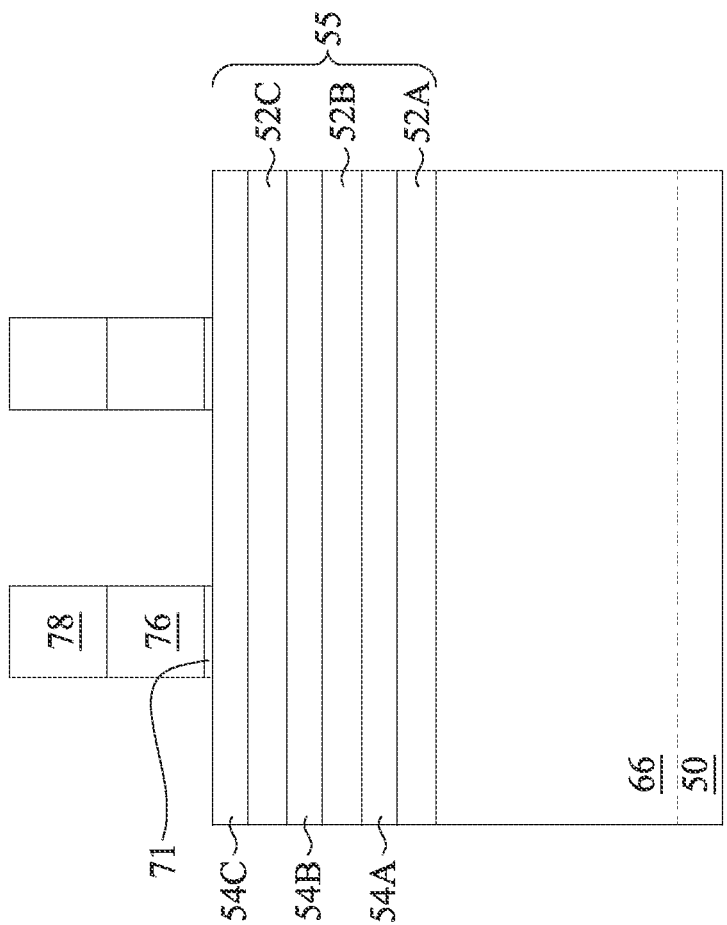
Figure 6A:
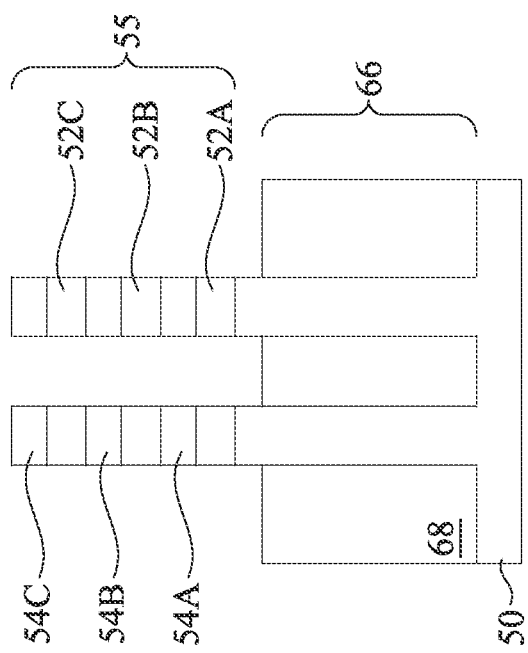
Figure 6C:
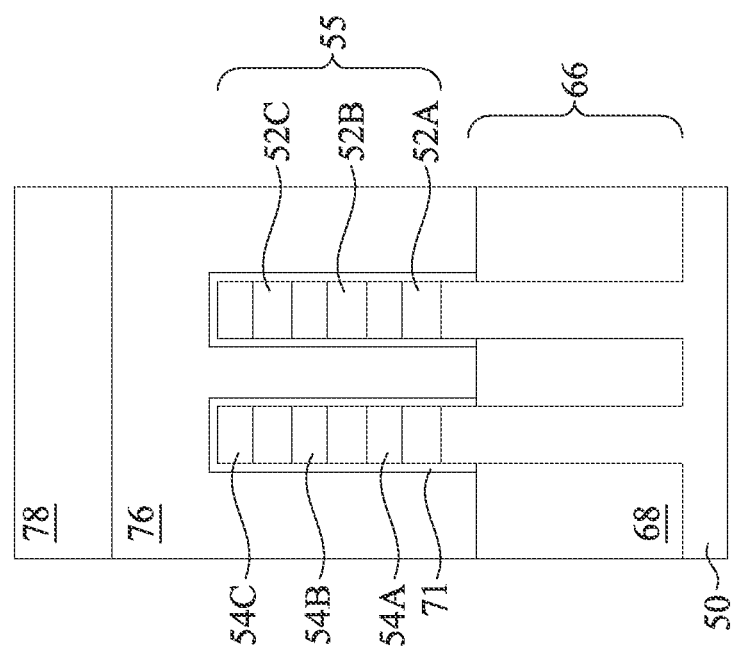

In FIGS. 6A, 6B, and 6C, the mask layer 74 (see FIG. 5) is patterned using acceptable photolithography and etching techniques to form masks 78, in accordance with some embodiments. FIG. 6A illustrates a cross-sectional view along the reference cross-section A-A' shown in FIG. 1, FIG. 6B illustrates a cross-sectional view along the reference cross-section B-B' shown in FIG. 1, and FIG. 6C illustrates a cross-sectional view along the reference cross-section C-C' shown in FIG. 1. The pattern of the masks 78 is transferred to the dummy gate layer 72 to form dummy gates 76 using an acceptable etching technique. The pattern of the masks 78 may optionally be transferred to the dummy dielectric layer 70 using an acceptable etching technique to form dummy gate dielectric layers 71. The dummy gates 76 cover portions of the nanostructures 55 that will be exposed in subsequent processing to form channel regions. Specifically, the dummy gates 76 extend along the portions of the second nanostructures 54 that will be patterned to form channel regions. The dummy gates 76 may have a longitudinal direction that is substantially perpendicular to the longitudinal direction of the fins 66. The masks can optionally be removed after patterning using any acceptable etching technique.

In FIGS. 7A and 7B, a first spacer layer 80 and a second spacer layer 82 are formed over the structures illustrated in FIGS. 6A-6C, in accordance with some embodiments. FIG. 7A illustrates a cross-sectional view along the reference cross-section A-A' shown in FIG. 1, FIG. 7B illustrates a cross-sectional view along the reference cross-section B-B' shown in FIG. 1. The first spacer layer 80 and the second spacer layer 82 are subsequently patterned to form first spacers 81 and second spacers 83 (see FIGS. 8A-8B), which are used for forming self-aligned epitaxial source/drain regions 94 (see FIGS. 17A-17C). FIGS. 7A-7B illustrate the formation of two spacer layers (e.g., a first spacer layer 80 and a second spacer layer 82), but in other embodiments a single spacer layer or more than two spacer layers are formed.

In FIGS. 7A and 7B, the first spacer layer 80 is formed on exposed surfaces of the STI regions 68, the fins 66, the nanostructures 55, masks 78, the dummy gates 76, and the dummy gate dielectric layers 71. The first spacer layer 80 may be conformally deposited, for example. The second spacer layer 82 is then formed over the first spacer layer 80, and may also be conformally deposited. The first spacer layer 80 may be formed of silicon oxide, silicon nitride, silicon oxynitride, silicon oxycarbonitride or the like, using suitable techniques such as thermal oxidation, CVD, ALD, or the like. The second spacer layer 82 may be formed of a material such as silicon oxide, silicon nitride, silicon oxynitride, silicon oxycarbonitride, or the like, and may be deposited by CVD, PECVD, ALD, PEALD, or the like. In some embodiments, the first spacer layer 80 is a different material than the second spacer layer 82. For example, the first spacer layer 80 and the second spacer layer 82 may be different materials having different etch rates.

After forming the first spacer layer 80 and prior to forming the second spacer layer 82, implants for lightly doped source/drain (LDD) regions (not separately illustrated) may be performed. In embodiments with different device types, similar to the implants discussed above in FIG. 4, a mask, such as a photoresist, may be formed over the n-type region 50N, while exposing the p-type region 50P, and appropriate type (e.g., p-type) impurities may be implanted into the exposed fins 66 and nanostructures 55 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 66 and nanostructures 55 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in a range from about $1\times10^{15}$ atoms/cm$^3$ to about $1\times10^{19}$ atoms/cm$^3$. An anneal may be used to repair implant damage and to activate the implanted impurities.

In FIGS. 8A and 8B, the first spacer layer 80 and the second spacer layer 82 are etched to form first spacers 81 and second spacers 83, in accordance with some embodiments. As will be discussed in greater detail below, the first spacers 81 and the second spacers 83 facilitate subsequent formation of self-aligned epitaxial source/drain regions 94 and protect sidewalls of the fins 66 and/or nanostructures 55 during subsequent processing steps. The first spacer layer 80 and the second spacer layer 82 may be etched using any acceptable etch process, such as a dry etch, a wet etch, the like, or a combination thereof. The etching may be anisotropic. In some embodiments, the material of the second spacer layer 82 has a different etch rate than the material of the first spacer layer 80. In such embodiments, the first spacer layer 80 may act as an etch stop layer when patterning the second spacer layer 82 and the second spacer layer 82 may act as a mask when patterning the first spacer layer 80. For example, the second spacer layer 82 may be etched using an anisotropic etch process for which the first spacer layer 80 acts as an etch stop layer, and remaining portions of the second spacer layer 82 form second spacers 83 (see FIG. 8A). After forming the second spacers 83, the second spacers 83 may act as a mask while etching exposed portions of the first spacer layer 80, thus forming first spacers 81 (see FIG. 8A). After etching, the first spacers 81 and the second spacers 83 can have straight sidewalls (as illustrated) or can have curved sidewalls (not separately illustrated). In other embodiments, only one set of spacers or more than two sets of spacers are formed.

As illustrated in FIG. 8A, the first spacers 81 and the second spacers 83 are disposed on sidewalls of the fins 66 and/or nanostructures 55. As illustrated in FIG. 8B, the first spacers 81 may extend on sidewalls of the masks 78, the dummy gates 76, and the dummy dielectric layers 71. Still referring to FIG. 8B, in some embodiments, the second spacer layer 82 may be removed from over the first spacer layer 80 adjacent the masks 78, the dummy gates 76, and the dummy gate dielectrics layers 71. In other embodiments, a portion of the second spacer layer 82 may remain over the first spacer layer 80 adjacent the masks 78, the dummy gates 76, and the dummy gate dielectric layers 71.

It is noted that the above disclosure generally describes a process of forming spacers and LDD regions. Other processes and sequences may be used. For example, fewer or additional spacers may be utilized, different sequence of steps may be utilized (e.g., the first spacers 81 may be patterned prior to depositing the second spacer layer 82), additional spacers may be formed and removed, and/or the like.

Figure 9B:
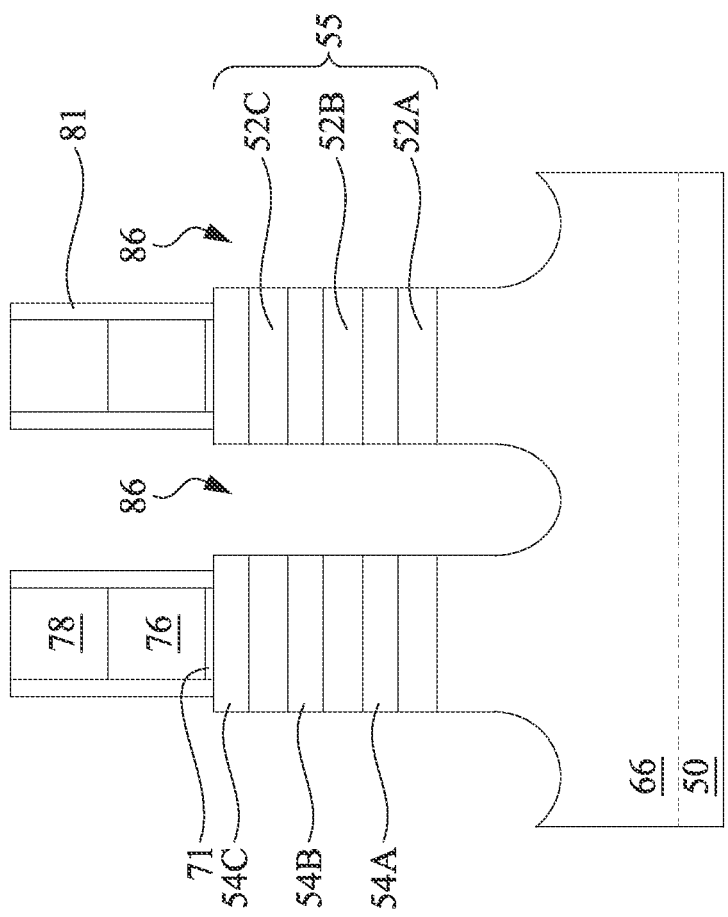
Figure 9A:
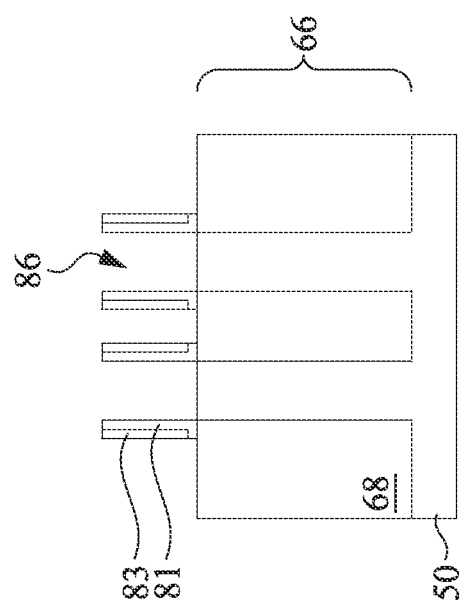

In FIGS. 9A and 9B, first recesses 86 are formed in the fins 66, the nanostructures 55, and the substrate 50, in accordance with some embodiments. Epitaxial source/drain regions 94 (see FIGS. 17A-17C) are subsequently formed in the first recesses 86. The first recesses 86 may extend through the first nanostructures 52 and the second nanostructures 54 and into the fins 66. In some embodiments, the first recesses 86 extend into the substrate 50. As illustrated in FIG. 9A, top surfaces of the STI regions 68 may be level with bottom surfaces of the first recesses 86. In other embodiments, top surfaces of the STI regions 68 may be above or below bottom surfaces of the first recesses 86. For clarity, the recesses 86 are shown having different depths into the fins 66 in FIGS. 9A and 9B, but note that a recess 86 may have the same depth when viewed in different cross-sections.

The first recesses 86 may be formed by etching the fins 66, the nanostructures 55, and the substrate 50 using one or more etching processes. The etching processes may include wet and/or dry etching processes and may include isotropic and/or anisotropic etching processes. For example, the etching processes may include an anisotropic dry etching process such as RIE, NBE, or the like. In some embodiments, the etch is an anisotropic dry etch performed with carbon tetrafluoride ($CF_4$), fluoromethane ($CH_3F$), hydrogen bromide (HBr), and oxygen ($O_2$) gas in helium (He) and/or argon (Ar) while generating a plasma with a bias voltage or a bias power. In some embodiments, the etch is an isotropic dry etch performed with nitrogen trifluoride ($NF_3$), chlorine ($Cl_2$) gas, and hydrogen ($H_2$) gas in helium (He) and/or argon (Ar). In some embodiments, the etching processes may include an anisotropic wet etching process comprising potassium hydroxide (KOH), tetra-methyl ammonium hydroxide (TMAH), ethylene di-amine pyro-catechol (EDP), the like, or combinations thereof. Other etching processes are possible. The first spacers 81, the second spacers 83, and the masks 78 may collectively mask portions of the fins 66, the nanostructures 55, and the substrate 50 during the etching processes. Timed etch processes may be used to stop the etching of the first recesses 86 after the first recesses 86 reach a desired depth. In some embodiments, the one or more etching processes may or may be controlled to achieve a particular profile of the sidewalls of the second nanostructures 54, such as those described below for FIGS. 11A-11E, and/or to achieve a particular profile of the first recesses 86 in the fins 66, such as those described below for FIGS. 12A-12C.

In FIGS. 10A and 10B, portions of sidewalls of the first nanostructures 52 are recessed, in accordance with some embodiments. The sidewalls of the first nanostructures 52 may be recessed, for example, using an etching process that etches sidewalls of the first nanostructures 52 exposed by the first recesses 86. The etching process may be any acceptable etching process, such as one that is selective to the first semiconductor material of the first nanostructures 52 (e.g., selectively etches the material of the first nanostructures 52 at a faster rate than the second semiconductor material of the second nanostructures 54). The etching may be isotropic. For example, for embodiments in which the first nanostructures 52 are formed of silicon germanium and the second nanostructures 54 are formed of silicon or silicon carbide, the etching process may include a selective wet etch using tetramethylammonium hydroxide (TMAH), ammonium hydroxide ($NH_4OH$), or the like. Other materials or etching processes are possible. In some embodiments, the same etching process(es) may be performed to both form the first recesses 86 and recess the sidewalls of the first nanostructures 52. In some embodiments, after recessing the sidewalls of the first nanostructures 52, the first recesses 86 in the fins 66 may have a depth D1 that is in the range of about 1 nm and about 50 nm, though other depths are possible.

Figure 11B:
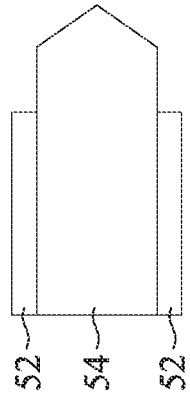
Figure 11E:
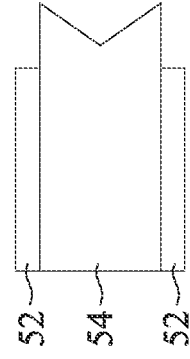
Figure 11C:
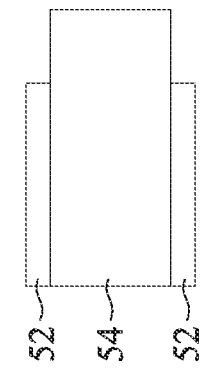
Figure 11A:
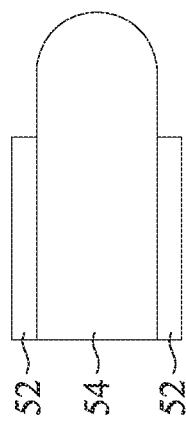
Figure 11D:
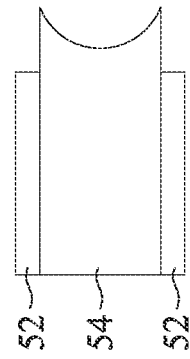

After performing the etching process(es) that form the first recesses 86 and/or the etching process(es) that recess the sidewalls of the first nanostructures 52, the sidewalls of the second nanostructures 54 exposed by the first recesses 86 may have a variety of profiles. FIGS. 11A-11E illustrate different sidewall profiles of a second nanostructure 54 in the region 11 indicated in FIG. 10B. In some cases, the sidewalls of the second nanostructures 54 may have a rounded convex profile, as shown by FIG. 11A. In some cases, the sidewalls of the second nanostructures 54 may have a polygonal convex profile, as shown by FIG. 11B. In some cases, the sidewalls of the second nanostructures 54 may have a substantially flat profile, as shown by FIG. 11C. A substantially flat profile may be approximately vertical or may be at an oblique angle. In some cases, the sidewalls of the second nanostructures 54 may have a rounded concave profile, as shown by FIG. 11D. In some cases, the sidewalls of the second nanostructures 54 may have a polygonal concave profile, as shown by FIG. 11E. Other sidewall profiles are possible. In this manner, one or more of the etching processes mentioned above may (or may not) reshape the sidewalls of the second nanostructures 54. Different types of etching processes or different etching parameters may form different sidewall profiles. In some cases, particular sidewall profiles may provide differences in device properties or device operation. In this manner, the parameters or types of the one or more etching processes may be controlled to achieve a particular sidewall profile that may, for example, improve device operation. Subsequent processing steps are shown for the embodiment of FIG. 11A, although those processing steps may be performed for any of the embodiments.

Figure 12C:
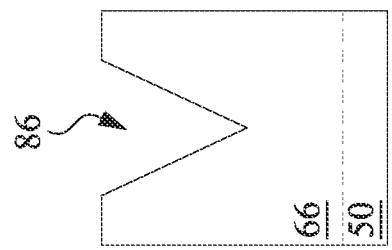
Figure 12B:
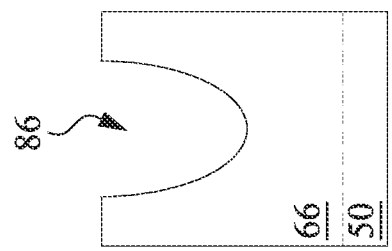
Figure 12A:
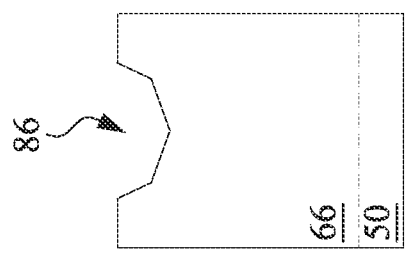

After performing the etching process(es) that form the first recesses 86 and/or the etching process(es) that recess the sidewalls of the first nanostructures 52, the first recesses 86 in the fins 66 may have a variety of profiles. FIGS. 12A-12C illustrate different profiles of a first recess 86 in the region 12 indicated in FIG. 10B. In some cases, the first recesses 86 in the fins 66 may have a relatively shallow profile, as shown by FIG. 12A. The bottom surfaces of the relatively shallow first recesses 86 may be rounded, faceted, or flat. In some cases, the first recesses 86 in the fins 66 may have a relatively deep rounded profile, as shown by FIG. 12B. The bottom surfaces of the relatively deep rounded first recesses 86 may be curved or flat. In some cases, the first recesses 86 in the fins 66 may have a relatively deep polygonal profile, as shown by FIG. 12C. The relatively deep profile may be tapered or triangular, as shown in FIG. 12C, or may have a different polygonal shape. For example, the bottom surfaces of the relatively deep polygonal first recesses 86 may be flat. Other profiles are possible. Different types of etching processes or different etching parameters may form different recess profiles. In some cases, particular recess profiles may provide differences in device properties or device operation. For example, some recess profiles may reduce leakage through the fins 66 (e.g., through a well formed in the fins 66) due to band-to-band tunneling, punch-through, or the like. In this manner, the parameters or types of the one or more etching processes may be controlled to achieve a particular recess profile that may, for example, reduce leakage or improve device operation. Subsequent processing steps are shown for the embodiment of FIG. 12B, although those processing steps may be performed for any of the embodiments.

Figure 13B:
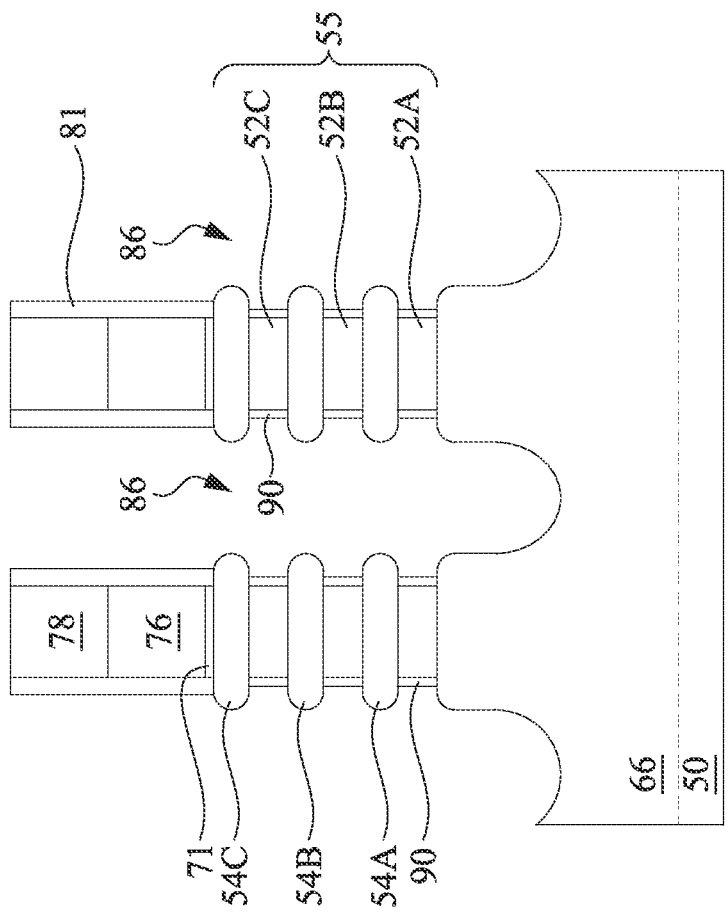
Figure 13A:
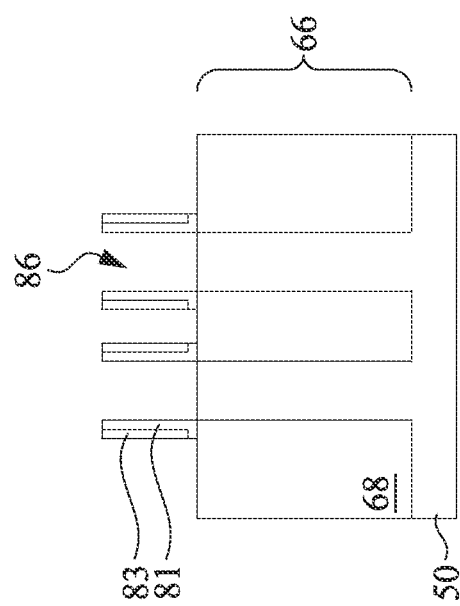
Figure 13C:
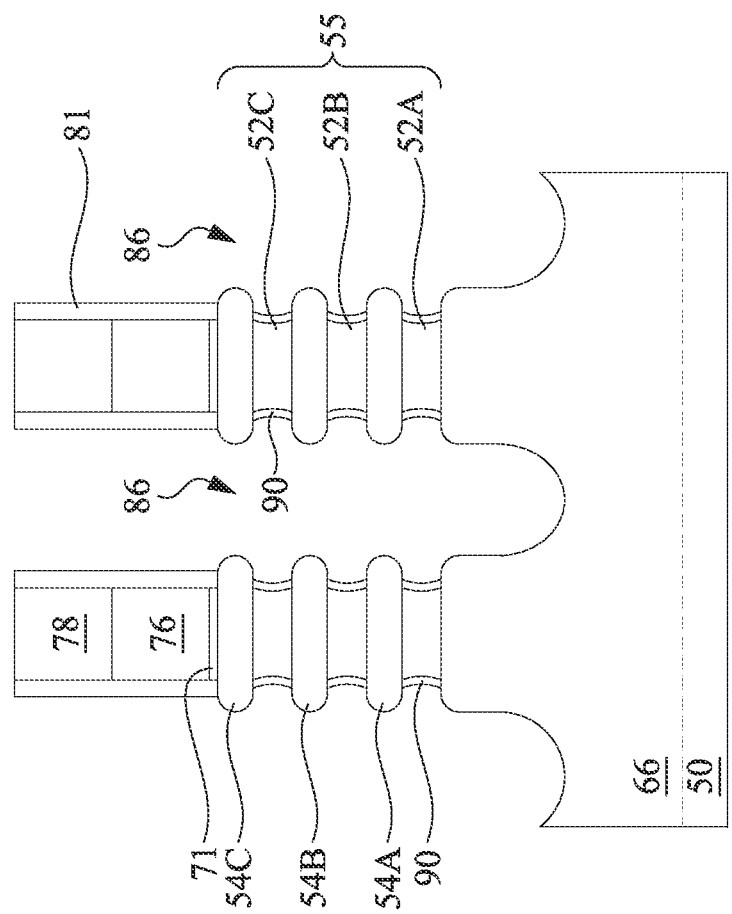

In FIGS. 13A-13C, inner spacers 90 are formed on the first nanostructures 52, in accordance with some embodiments. The inner spacers 90 act as isolation features between the subsequently formed epitaxial source/drain regions 94 and the subsequently formed gate structures (see FIGS. 22A-22C). Further, the inner spacers 90 may be used to substantially prevent damage to the subsequently formed epitaxial source/drain regions 94 by subsequent etching processes, such as etching processes used to subsequently remove the first nanostructures 52.

The inner spacers 90 may be formed, for example, by depositing an inner spacer layer (not separately illustrated) over the structures illustrated in FIGS. 10A-10B and then etching the inner spacer layer to form the inner spacers 90. The inner spacer layer may be deposited, for example, by a conformal deposition process, such as CVD, ALD, or the like. The inner spacer layer may be a dielectric material such as silicon nitride, silicon oxynitride, silicon oxycarbonitride, the like, or a combination thereof. In some embodiments, the inner spacer layer comprises low-k dielectric material (e.g., dielectric materials having a k-value less than about 3.5). The inner spacer layer may be deposited using a conformal deposition process, such as ALD, CVD, or the like. Other dielectric materials formed by any acceptable process may be used for the inner spacer layer.

After depositing the inner spacer layer, an etching process is performed to remove portions of the inner spacer layer from surfaces of the fins 66 and from surfaces of the second nanostructures 54. The remaining portions of the inner spacer layer on the sidewalls of the first nanostructures 52 form the inner spacers 90. The inner spacer layer may be etched using any acceptable etch process, such as a reactive ion etch (RIE), neutral beam etch (NBE), the like, or a combination thereof. The etching may be anisotropic. FIG. 13B illustrates the inner spacers 90 as being recessed from the ends of the second nanostructures 54 (e.g., the second nanostructures 54 protrude from the inner spacers 90), but in other embodiments the inner spacers 90 may protrude from the second nanostructures 54 or the inner spacers 90 and the second nanostructures 54 may have substantially coplanar sidewalls. Moreover, although the sidewalls of the inner spacers 90 are illustrated as being substantially straight in FIG. 13B, the sidewalls of the inner spacers 90 may be concave or convex in other embodiments. As an example, FIG. 13C illustrates an embodiment in which sidewalls of the first nanostructures 52 are concave, sidewalls of the inner spacers 90 are concave, and the inner spacers 90 are recessed from sidewalls of the second nanostructures 54. Subsequent processing steps are shown for the embodiment of FIG. 13B, although those processing steps may be performed for any of the embodiments.

FIGS. 14A through 17C, illustrate intermediate steps in the formation of epitaxial source/drain regions 94, in accordance with some embodiments. The formation of the epitaxial source/drain regions 94 comprises the formation of first epitaxial regions 91 in the first recesses 86 and then the formation of second epitaxial regions 92 on the first epitaxial regions 91. In some embodiments, the first epitaxial regions 91 or the second epitaxial regions 92 may comprise multiple epitaxial layers. In some embodiments, the first epitaxial region 91 has a different composition or doping concentration than the second epitaxial region 92, which can provide advantages (described in greater detail below).

Figure 14B:
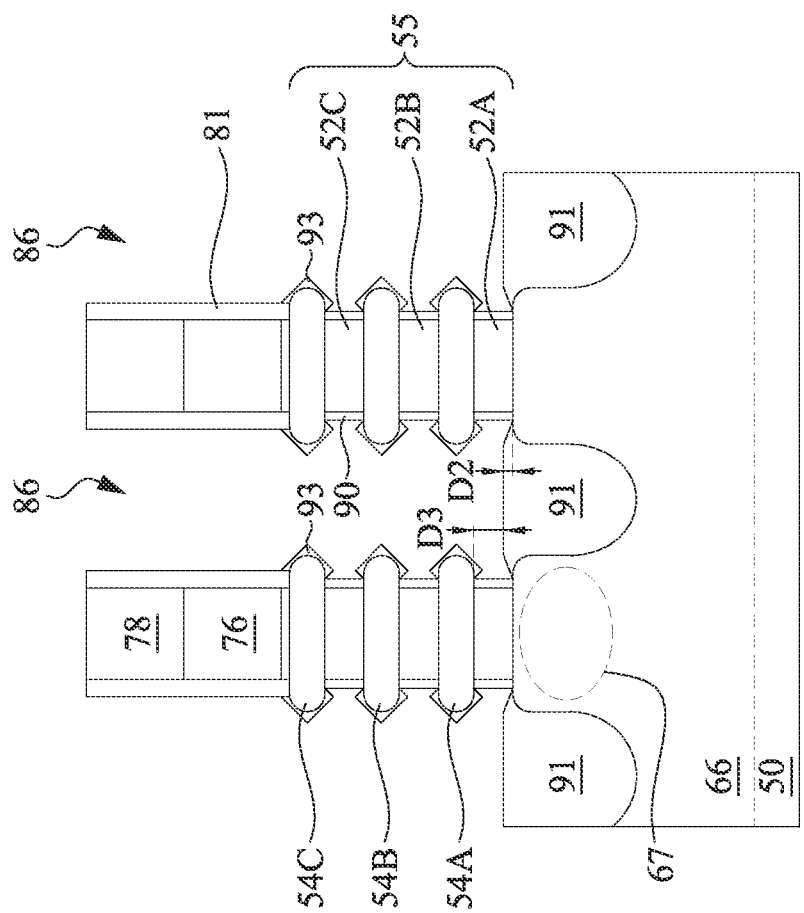
Figure 14A:
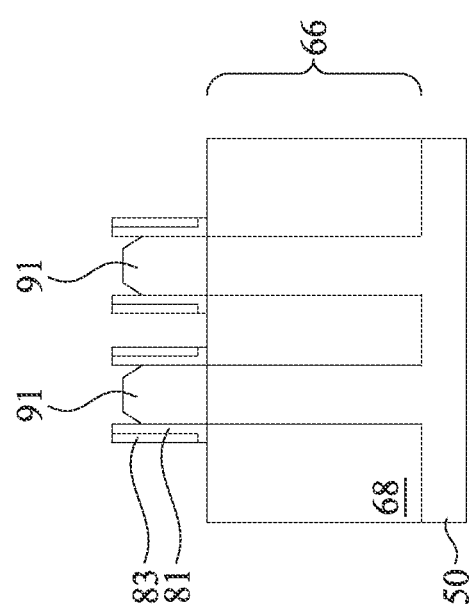

FIGS. 14A through 16E illustrate the formation of first epitaxial regions 91 and sidewall epitaxial regions 93 in the first recesses 86, in accordance with some embodiments. FIG. 14A illustrates a cross-sectional view along the reference cross-section A-A' shown in FIG. 1, and FIGS. 14B and 14C illustrate cross-sectional views along the reference cross-section B-B' shown in FIG. 1. The first epitaxial regions 91 are epitaxially grown in the first recesses 86 in the fins 66 using a first epitaxial growth process. The first epitaxial regions 91 may have surfaces raised from respective upper surfaces of the fins 66 and may have facets, in some embodiments. The top surfaces of the first epitaxial regions 91 may be below, above, or approximately level with top surfaces of the fins 66. For example, the top surfaces of the first epitaxial regions 91 may be a distance D2 above the top surfaces of the fins 66 that is in the range of about 1 nm to about 20 nm. In other embodiments, the top surfaces of the first epitaxial regions 91 are a distance below the top surfaces of the fins 66 that is in the range of about 1 nm to about 20 nm. Other distances above or below the top surfaces of the fins 66 are possible. In some embodiments, a distance D3 between the top surfaces of the first epitaxial regions 91 and the bottom surfaces of the bottommost second nanostructure 54 (e.g., second nanostructure 54A) is in the range of about 3 nm to about 30 nm, though other distances are possible.

In some embodiments, the first epitaxial growth process also forms sidewall epitaxial regions 93 on exposed surfaces (e.g., sidewall portions) of the second nanostructures 54. FIG. 14B shows an embodiment in which the sidewall epitaxial regions 93 are formed during the first epitaxial growth process. Because they are formed using the same first epitaxial growth process, the first epitaxial regions 91 and the sidewall epitaxial regions 93 have approximately the same composition. In some cases, the first epitaxial growth process has a greater vertical deposition rate than horizontal deposition rate, which results in the sidewall epitaxial regions 93 having a slower growth rate than the first epitaxial regions 91. In this manner, the first epitaxial regions 91 in the first recesses 86 may be thicker than the sidewall epitaxial regions 93 on the second nanostructures 54.

Figure 14C:
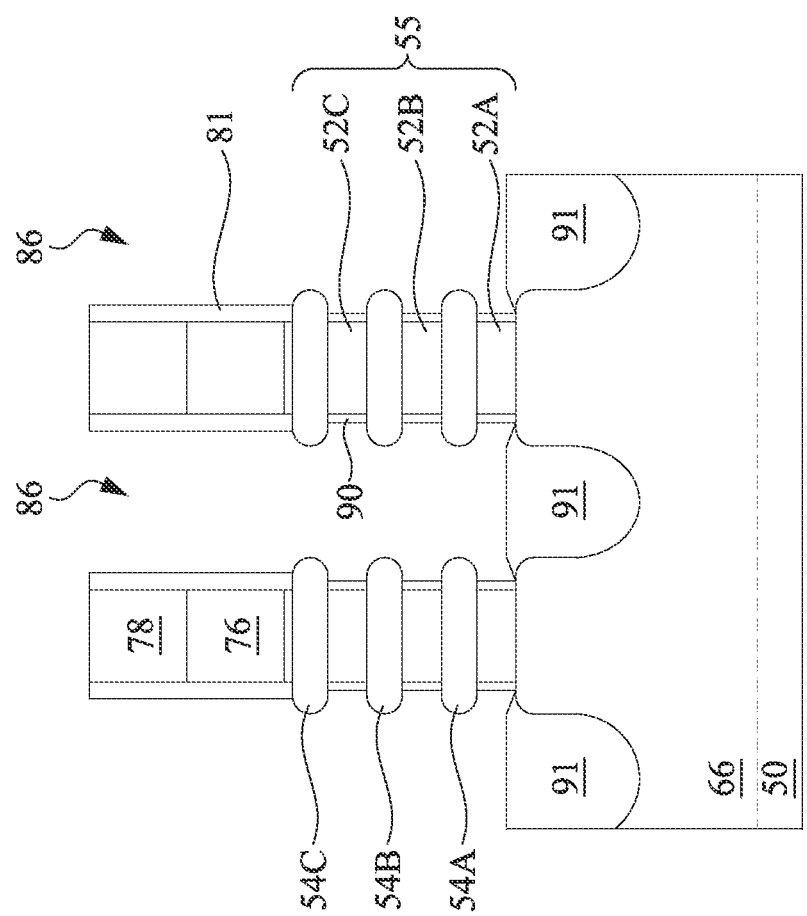

In some embodiments, the sidewall epitaxial regions 93 are left remaining on the second nano structures 54 during subsequent processing steps. In other embodiments, an etching process is performed to remove the sidewall epitaxial regions 93 from the second nanostructures 54 before performing subsequent processing steps. FIG. 14C illustrates an embodiment in which the sidewall epitaxial regions 93 have been removed. The etching process may include a wet etching process and/or a dry etching process. For example, the etching process may be a dry etching process using process gases comprising HCl, Cl$_2$, or the like, which may have a process temperature in the range of about 600° C. to about 700° C. or a process pressure in the range of about 1 Torr to about 760 Torr. Other etching processes, process gases, or process parameters are possible. Subsequent processing steps are shown for the embodiment of FIG. 13B, although those processing steps may be performed for any of the embodiments.

FIGS. 15A-15E and 16A-16E illustrate different profiles of sidewall epitaxial regions 93 formed on second nanostructures 54, in accordance with some embodiments. The second nanostructures 54 shown in FIGS. 15A-15E and 16A-16E correspond to the second nanostructures 54 shown in FIGS. 11A-11E. FIGS. 15A-15E illustrate sidewall epitaxial regions 93 having faceted profiles due to facet-limited growth by the first epitaxial growth process. For example, in some embodiments, the first epitaxial growth process is a <111> facet-limited growth process, and thus sidewall epitaxial regions 93 may be grown having <111> facets. Other facets or combinations of facets are possible. FIGS. 16A-16E illustrate sidewall epitaxial regions 93 having conformal profiles due to conformal growth by the first epitaxial growth process. The sidewall epitaxial regions 93 shown in FIGS. 15A-16E are examples, and sidewall epitaxial regions 93 may have profiles that are a combination of faceted and conformal growth, or may have other profiles than described herein. In some embodiments, the relative amount of faceted growth or conformal growth can be controlled by controlling the parameters of the first epitaxial process, such as the mixture of process gases, the precursor flow rates, the process temperature, or the like. Subsequent processing steps are shown for the embodiment of FIG. 15A, although those processing steps may be performed for any of the embodiments.

In some embodiments, the first epitaxial regions 91 (and the sidewall epitaxial regions 93) comprise doped or undoped semiconductor materials. The doping concentration and/or the composition of the semiconductor materials may be uniform or have a gradient. In some embodiments, the first epitaxial regions 91 may comprise materials such as silicon, silicon germanium, boron-doped silicon germanium, germanium, germanium tin, or the like. For example, in some embodiments, the first epitaxial regions 91 may be silicon that is doped with a p-type impurity such as boron. Other materials, dopants, or combinations thereof are possible. In some embodiments, the first epitaxial regions 91 may be in situ doped during growth, using the first epitaxial growth process. In some embodiments, the first epitaxial regions 91 may be implanted with dopants, similar to the process previously discussed for forming lightly-doped source/drain regions, followed by an anneal. In some embodiments, the first epitaxial regions 91 may have a p-type impurity concentration in the range of about $1\times10^{17}$ atoms/cm$^3$ to about $1\times10^{20}$ atoms/cm$^3$, though other impurity concentrations are possible.

In some embodiments, the impurity concentration of the first epitaxial regions 91 may be relatively low. For example, the impurity concentration of the first epitaxial regions 91 may be smaller than the impurity concentration of the overlying second epitaxial regions 92, described in greater detail below. In some cases, forming first epitaxial regions 91 having a relatively low impurity concentration can reduce leakage current in the fins 66. For example, in some cases, a leakage current may be present in regions 67 of the fins 66 that are between adjacent epitaxial source/drain regions 94 (see FIGS. 14B and 17B). The leakage current in the regions 67 may be caused by, for example, band-to-band tunneling of carriers between the epitaxial source/drain regions 94 and the fins 66. By reducing the impurity concentration of the first epitaxial regions 91 in the first recesses 86 in the fins 66, the band-to-band tunneling between the first epitaxial regions 91 and the fins 66 may be reduced, and thus the leakage current in regions 67 may be reduced. In this manner, the first epitaxial regions 91 in the first recesses 86 may reduce leakage between the epitaxial source/drain regions 94. In some embodiments, initially grown portions of the first epitaxial regions 91 may have a lower impurity concentration than subsequently grown portions of the first epitaxial regions 91. For example, the first epitaxial regions 91 may have a gradient impurity concentration profile, though other impurity concentration profiles are possible.

In other embodiments, the first epitaxial regions 91 (and the sidewall epitaxial regions 93) may be doped with n-type impurities. For example, in some embodiments, the first epitaxial regions 91 may be silicon that is doped with an n-type impurity such as phosphorus, arsenic, or the like. Other materials, dopants, or combinations thereof are possible. In some embodiments, the first epitaxial regions 91 may be in situ doped during growth, using the first epitaxial growth process. In some embodiments, the first epitaxial regions 91 may be implanted with dopants, similar to the process previously discussed for forming lightly-doped source/drain regions, followed by an anneal. In some embodiments, the first epitaxial regions 91 may have an n-type impurity concentration in the range of about $1\times10^{17}$ atoms/cm$^3$ to about $1\times10^{20}$ atoms/cm$^3$, though other impurity concentrations are possible. In some embodiments, initially grown portions of the first epitaxial regions 91 may have a lower impurity concentration than subsequently grown portions of the first epitaxial regions 91. For example, the first epitaxial regions 91 may have a gradient impurity concentration profile, though other impurity concentration profiles are possible. In some cases, forming p-type epitaxial source/drain regions 94 over n-type fins 66 and/or substrate 50 can cause current leakage in the regions 67 due to punch-through effects. By forming first epitaxial regions 91 that are doped with an n-type impurity as described herein, punch-through effects in the regions 67 can be reduced or eliminated, and thus current leakage due to punch-through can be reduced or eliminated.

In some embodiments, when the first epitaxial regions 91 comprise silicon, the first epitaxial growth process may use a silicon-containing precursor such as a silane, such as monosilane (SiH$_4$), disilane (Si$_2$H$_6$), trisilane (Si$_3$H$_8$), trichlorosilane (HCl$_3$Si), dichlorosilane (H$_2$SiCl$_2$), or the like. When the first epitaxial regions 91 comprise germanium, the first epitaxial growth process may use a germanium-containing precursor such as germane (GeH$_4$) or the like. In some cases, increasing the proportion of germanium-containing precursor to silicon-containing precursor (e.g., the proportion of their flow rates) during the first epitaxial growth process may promote facet-limited growth over conformal growth. Other silicon-containing or germanium-containing precursors are possible.

The first epitaxial growth process may include in situ doping, in some embodiments. When the dopant is boron, the dopant-containing precursor may be a boron-containing precursor such as diborane (B$_2$H$_6$) or the like. When the dopant is arsenic, the dopant-containing precursor may be an arsenic-containing precursor such as arsine (AsH$_3$) or the like. When the dopant is phosphorous, the dopant-containing precursor may be a phosphorous-containing precursor such as diphosphine (P$_2$H$_6$), phosphorus trichloride (PCl$_3$), or the like. Other dopant-containing precursors are possible.

In some embodiments, the first epitaxial growth process comprises one or more other process gases, such as HCl or the like. In some cases, the use of HCl during the first epitaxial growth process may promote facet-limited growth over conformal growth. In some embodiments, the first epitaxial growth process is performed at a process temperature in the range of about 400° C. to about 800° C., and at a process pressure in the range of about 1 Torr to about 760 Torr. In some cases, increasing the process temperature during the first epitaxial growth process may promote facet-limited growth over conformal growth. Other precursors, process gases, or process parameters are possible.

Figure 17C:
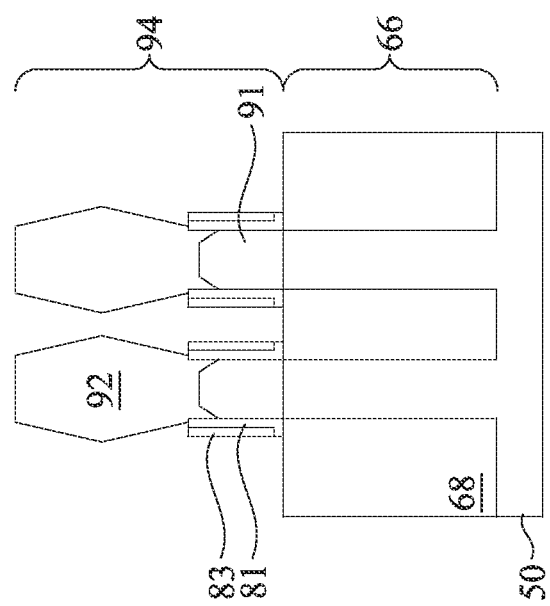

In FIGS. 17A-17C, a second epitaxial growth process is performed to form second epitaxial regions 92 over the first epitaxial regions 91, in accordance with some embodiments. The first epitaxial regions 91 and the second epitaxial regions 92 together comprise the epitaxial source/drain regions 94. The second epitaxial regions 92 may include any acceptable materials appropriate for p-type devices, which may include those described previously for the first epitaxial regions 91. For example, the second epitaxial regions 92 may include materials such as silicon, silicon germanium, silicon germanium, germanium, germanium tin, or the like, and which may be doped with a p-type impurity such as boron or the like. In some embodiments, the second epitaxial regions 92 include materials exerting a compressive strain on the second nanostructures 54, which can improve device performance. The second epitaxial regions 92 may have surfaces raised from respective surfaces of the second nanostructures 54 or sidewall epitaxial regions 93, and may have facets.

In some embodiments, the second epitaxial regions 92 may be in situ doped during growth, using the second epitaxial growth process. In some embodiments, the second epitaxial regions 92 may be implanted with dopants, similar to the process previously discussed for forming lightly-doped source/drain regions, followed by an anneal. In some embodiments, the second epitaxial regions 92 may have a p-type impurity concentration in the range of about $1\times10^{19}$ atoms/cm$^3$ to about $1\times10^{21}$ atoms/cm$^3$, though other impurity concentrations are possible. In some embodiments, the second epitaxial regions 92 have an impurity concentration that is different from the first epitaxial regions 91. For example, the impurity concentration of the first epitaxial regions 91 may be less than the impurity concentration of the second epitaxial regions 92, which may reduce leakage as described previously.

In some embodiments, the second epitaxial regions 92 may have a composition that is different from the composition of the first epitaxial regions 91. For example, in some embodiments, the first epitaxial regions 91 and the second epitaxial regions may both comprise silicon germanium, but the first epitaxial regions 91 may have a smaller atomic fraction of germanium than the second epitaxial regions 92. In some embodiments, the second epitaxial regions 92 may be silicon germanium having a composition described by $Si_{1-x}Ge_x$, wherein x represents an atomic fraction of germanium, and the first epitaxial regions 91 may be silicon germanium having a composition described by $Si_{1-y}Ge_y$, wherein y represents an atomic fraction of germanium that is different from x. For example, in some embodiments, the second epitaxial regions 92 may have an atomic fraction x in the range of about 0.2 to about 0.8, and the first epitaxial regions 91 may have an atomic fraction y that is less than x. In some embodiments, the atomic fraction y may be less than about 0.2. Other atomic fractions are possible.

In some cases, forming second epitaxial regions 92 having a greater atomic fraction of germanium than first epitaxial regions 91 can improve carrier transport efficiency of the device. For example, first epitaxial regions 91 with a smaller atomic fraction of germanium may have a valence band that is energetically offset relative to the valence band of second epitaxial regions 92 with a larger atomic fraction of germanium. This valence band offset can block or partially block holes from flowing from the second epitaxial regions 92 into the first epitaxial regions 91. In this manner, the hole carriers within the epitaxial source/drain regions 94 may be more confined to regions near the second nanostructures 54, which can increase current density and/or efficiency of the device. This also can block or partially block hole carriers from reaching the fins 66, which can reduce device leakage in the regions 67.

In some embodiments, the second epitaxial growth process is performed using techniques similar to those used for the first epitaxial growth process. For example, the second epitaxial growth process may use silicon-containing precursors, germanium-containing precursors, and/or dopant-containing precursors similar to those described previously for the first epitaxial growth process. In some embodiments, the second epitaxial growth process is performed at a process temperature in the range of about 400° C. to about 800° C., and at a process pressure in the range of about 1 Torr to about 760 Torr. The second epitaxial growth process that forms the second epitaxial regions 92 may have different process parameters (e.g., temperature, pressure, flow rates, etc.), precursors, process gases, or the like than the first epitaxial growth process that forms the first epitaxial regions 91. Other precursors, process gases, or process parameters are possible.

As illustrated in FIG. 17B, the epitaxial source/drain regions 94 are formed in the first recesses 86 such that each dummy gate 76 is disposed between respective neighboring pairs of the epitaxial source/drain regions 94. In some embodiments, the first spacers 81 are used to separate the epitaxial source/drain regions 94 from the dummy gates 76 and the inner spacers 90 are used to separate the epitaxial source/drain regions 94 from the first nanostructures 52 by an appropriate lateral distance so that the epitaxial source/drain regions 94 do not short out with subsequently formed gates of the resulting nano-FETs.

As a result of the epitaxy processes used to form the epitaxial source/drain regions 94, upper surfaces of the epitaxial source/drain regions 94 may have facets which expand laterally outward beyond sidewalls of the nanostructures 55. In some embodiments, these facets cause adjacent epitaxial source/drain regions 94 of a same nano-FET to merge as illustrated by FIG. 17A. In other embodiments, adjacent epitaxial source/drain regions 94 remain separated after the epitaxy processes are completed, as illustrated by FIG. 17C. In the embodiments illustrated in FIGS. 17A and 17C, the first spacers 81 may be formed to a top surface of the STI regions 68, thereby blocking the epitaxial growth. In some other embodiments, the first spacers 81 may cover portions of the sidewalls of the nanostructures 55, further blocking the epitaxial growth. In some other embodiments, the etching process used to form the first spacers 81 may be adjusted to remove the spacer material to allow the epitaxial growth to extend to the surface of the STI region 68.

Figure 18B:
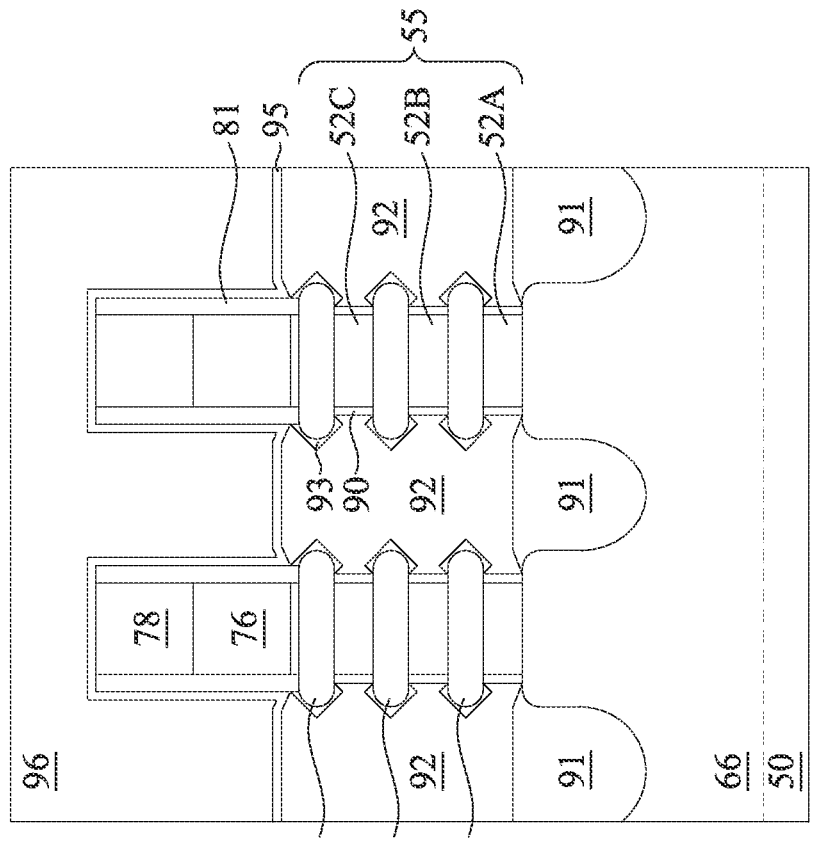
Figure 18A:
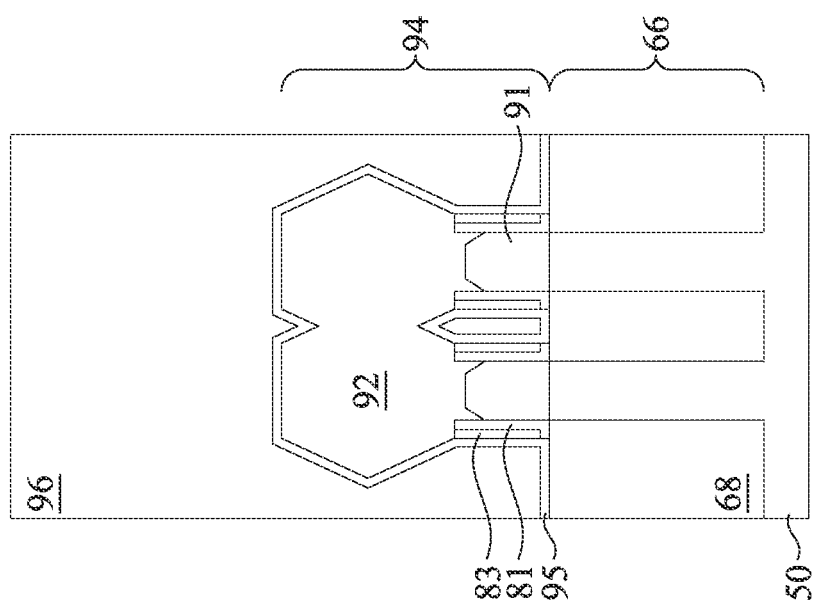
Figure 18C:
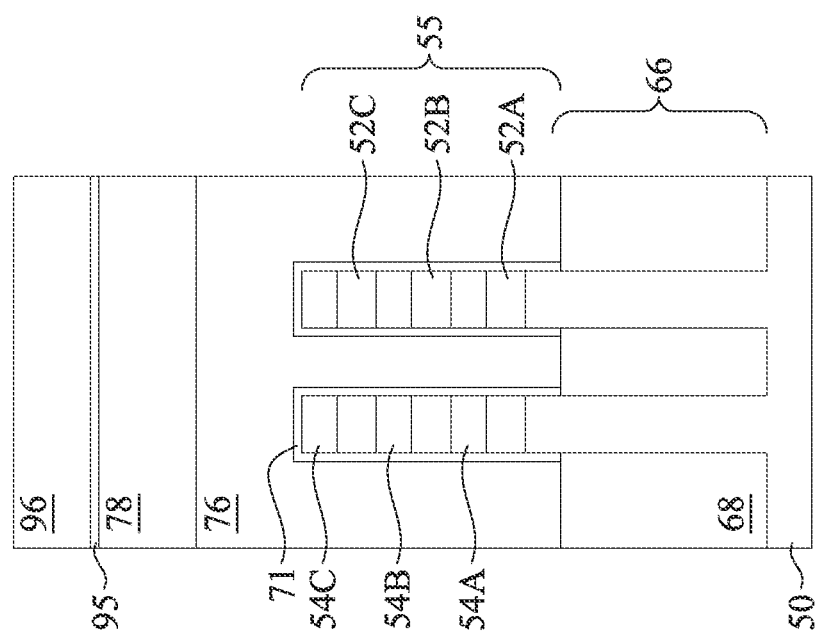

In FIGS. 18A-18C, a first interlayer dielectric (ILD) 96 is deposited over the epitaxial source/drain regions 94, the masks 78, the first spacers 81, and the second spacers 83. FIG. 18A illustrates a cross-sectional view along the reference cross-section A-A' shown in FIG. 1, FIG. 18B illustrates a cross-sectional view along the reference cross-section B-B' shown in FIG. 1, and FIG. 18C illustrates a cross-sectional view along the reference cross-section C-C' shown in FIG. 1. The first ILD 96 may be formed of a dielectric material, and may be deposited by any suitable method, such as CVD, PECVD, FCVD, or the like. The first ILD 96 may include materials such as phospho-silicate glass (PSG), boro-silicate glass (BSG), boron-doped phospho-silicate glass (BPSG), undoped silicate glass (USG), or the like. Other dielectric materials formed by any acceptable process may be used.

In some embodiments, a contact etch stop layer (CESL) 95 is formed between the first ILD 96 and the epitaxial source/drain regions 94, the masks 78, and the first spacers 81. The CESL 95 may comprise a dielectric material, such as silicon nitride, silicon oxide, silicon oxynitride, or the like. In some embodiments, the CESL 95 may be a material having a different etch rate than the material of the overlying first ILD 96. The CESL 95 may be formed using any suitable process, such as CVD, ALD, or the like.

Figure 19C:
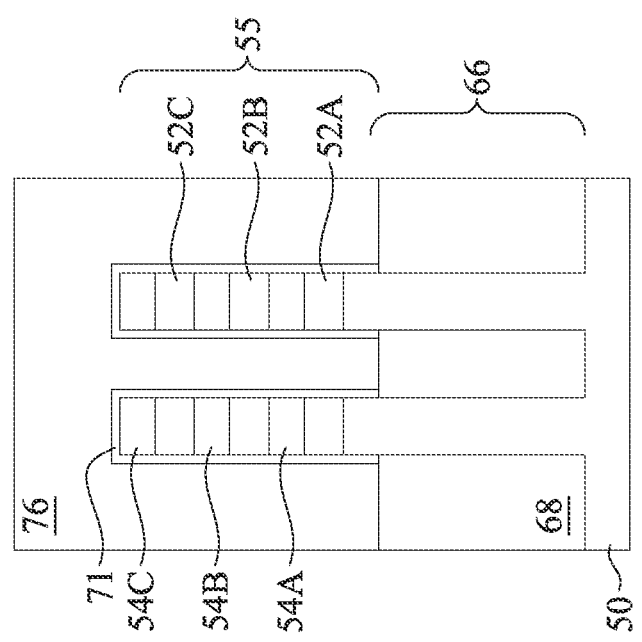

In FIGS. 19A-19C, a planarization process is performed to level the top surface of the first ILD 96 with the top surfaces of the first spacers 81, the dummy gates 76, and/or the masks 78, in accordance with some embodiments. The planarization process may also remove the masks 78 on the dummy gates 76 and portions of the first spacers 81 along sidewalls of the masks 78. After the planarization process, top surfaces of the dummy gates 76, the first spacers 81, and the first ILD 96 may be level (within process variations). Accordingly, the top surfaces of the dummy gates 76 may be exposed through the first ILD 96. In other embodiments, portions of the masks 78 may remain over the dummy gates 76, and the planarization process levels the top surface of the first ILD 96 with top surfaces of the masks 78 and the first spacers 81.

Figures 20A, 20B:
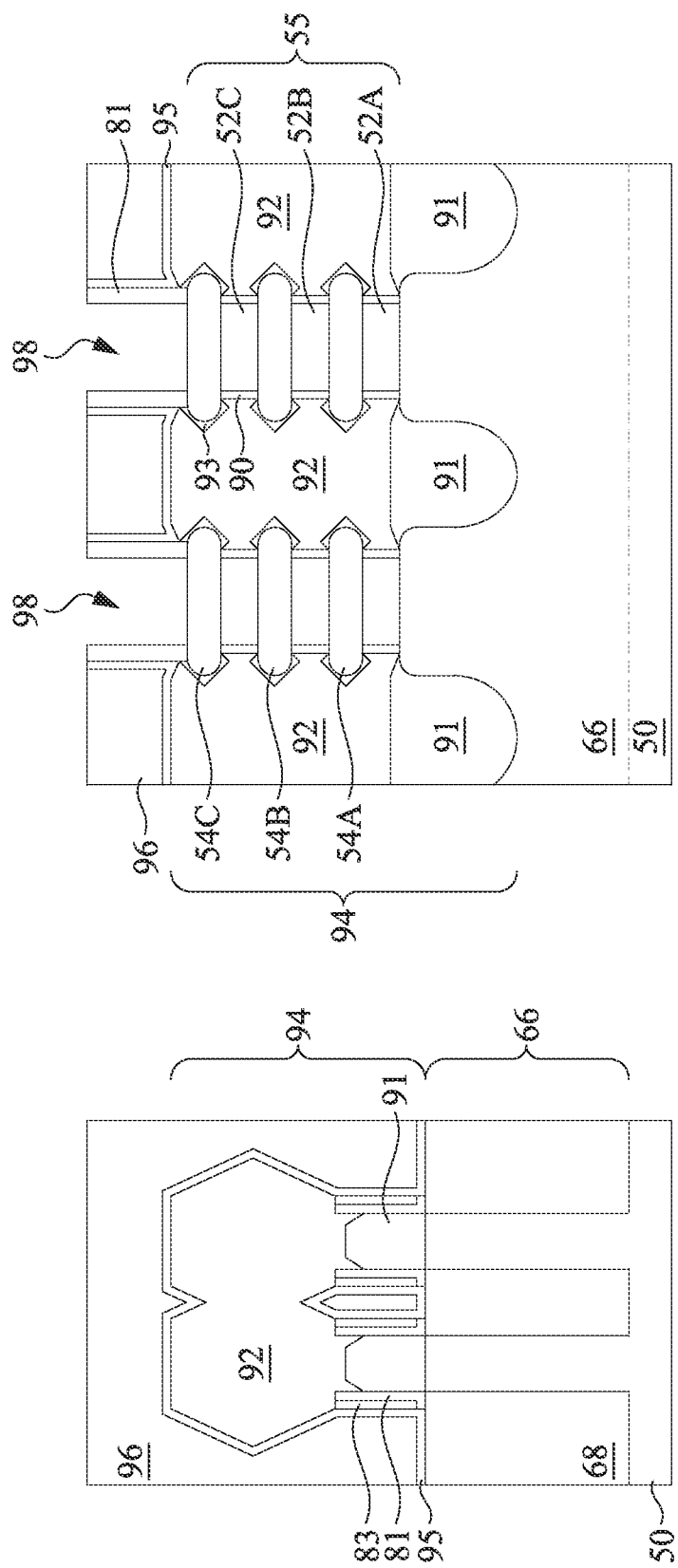
Figure 20C:
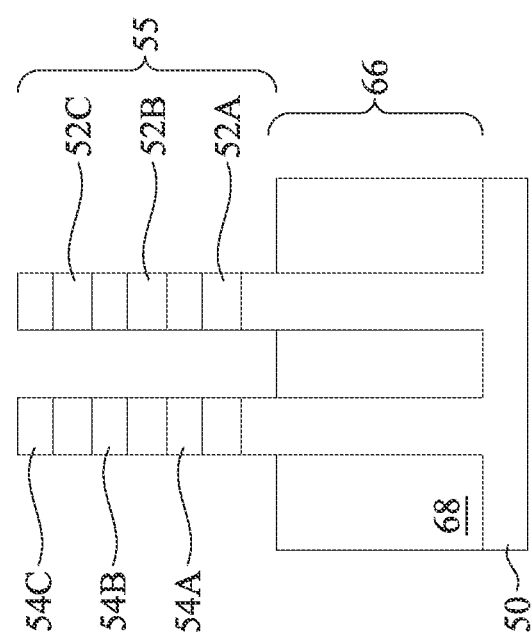

In FIGS. 20A-20C, the dummy gates 76 and the masks 78 (if present) are removed using one or more etching processes to form second recesses 98, in accordance with some embodiments. Portions of the dummy gate dielectric layers 71 in the second recesses 98 are also be removed. In some embodiments, the dummy gates 76 and the dummy gate dielectric layers 71 are removed using an anisotropic dry etch process. For example, the etching process may include a dry etch process using reaction gas(es) that selectively etch the dummy gates 76 at a faster rate than the first ILD 96 or the first spacers 81. During the removal, the dummy gate dielectric layers 71 may be used as etch stop layers when the dummy gates 76 are etched. The dummy gate dielectric layers 71 are then removed. Each second recess 98 exposes and/or overlies portions of the second nanostructures 54. Portions of the second nanostructures 54 which act as the channel regions are disposed between and adjoin adjacent pairs of the epitaxial source/drain regions 94.

Figure 21B:
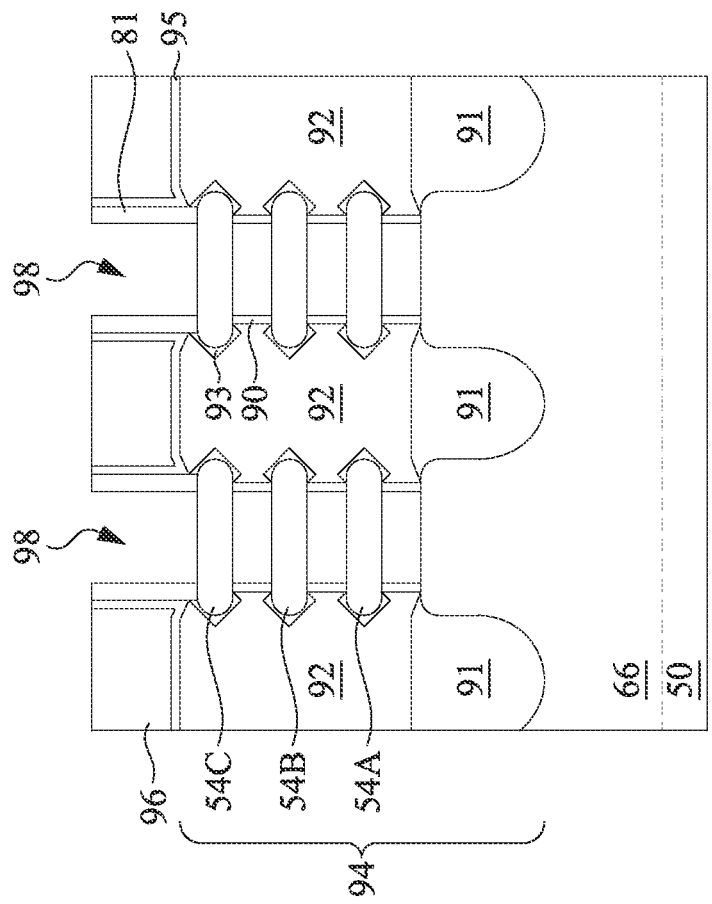
Figure 21A:
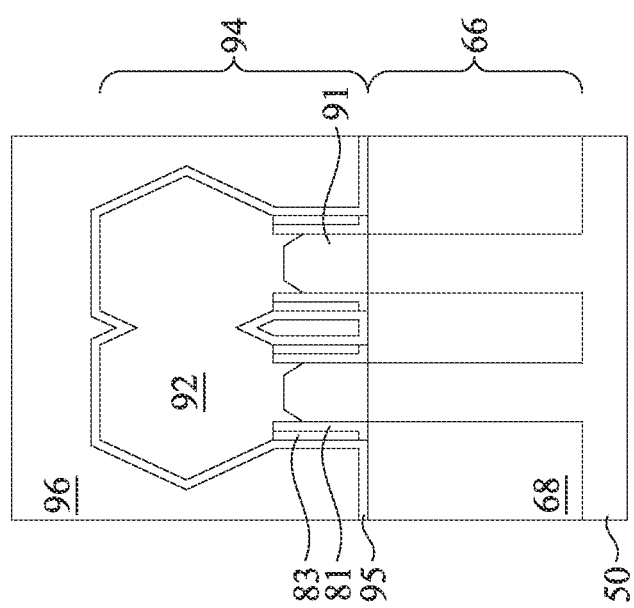

In FIGS. 21A-21C, the first nanostructures 52 are removed, in accordance with some embodiments. Removing the first nanostructures 52 extends the second recesses 98 such that openings are formed between the second nanostructures 54. The first nanostructures 52 can be removed by any acceptable etching process that selectively etches the material of the first nanostructures 52 at a faster rate than the material of the second nano structures 54. The etching may be isotropic. For example, in embodiments in which the first nanostructures 52 are formed of silicon germanium and the second nanostructures 54 are formed of silicon, the etching process may include a wet etch using tetramethylammonium hydroxide (TMAH), ammonium hydroxide (NH$_4$OH), or the like.

Figure 22B:
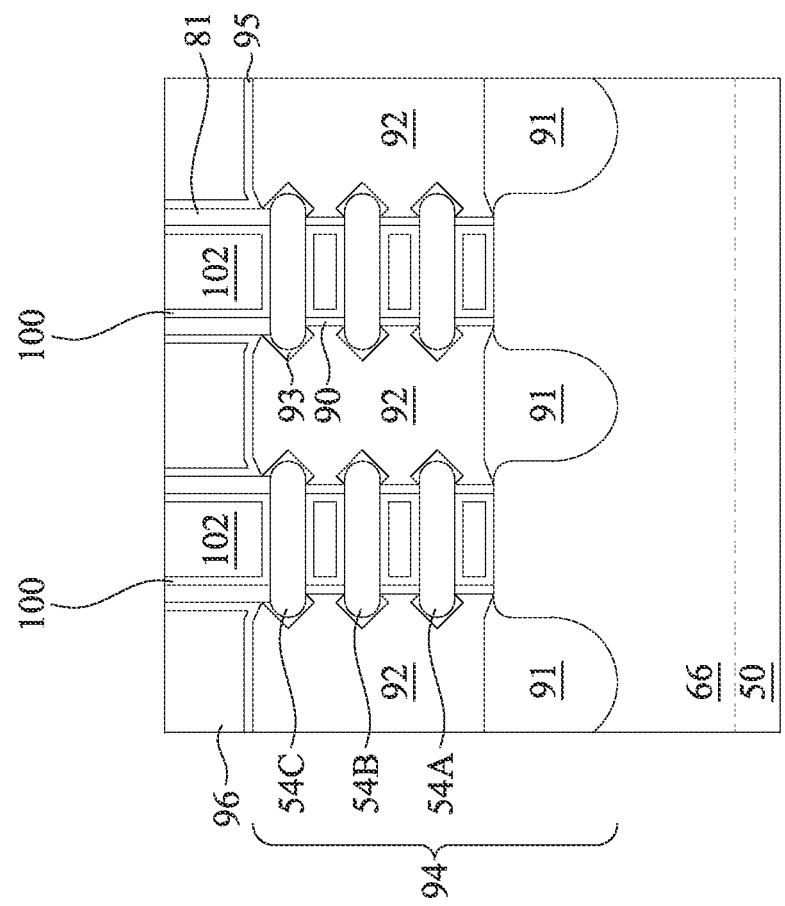
Figure 22A:
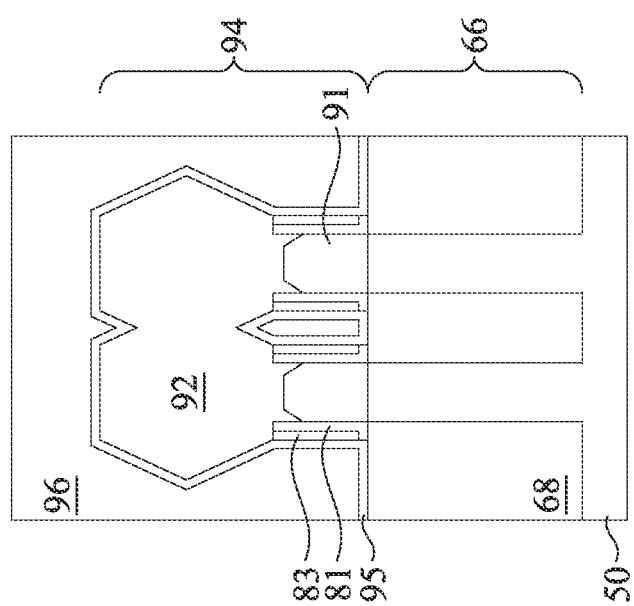
Figure 22C:
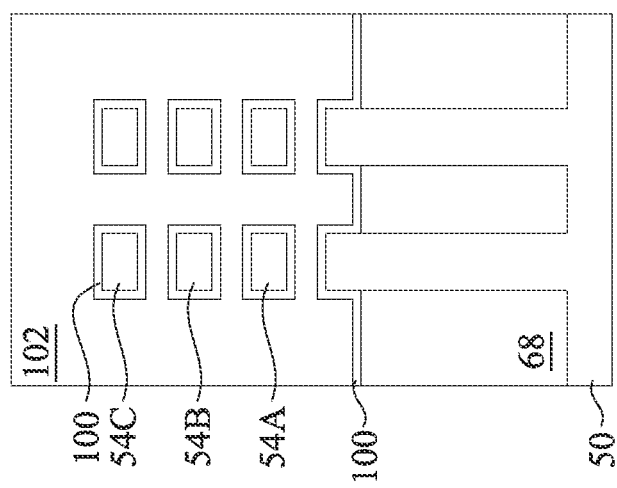

In FIGS. 22A-22C, gate dielectric layers 100 and gate electrodes 102 are formed for replacement gates, in accordance with some embodiments. Each respective pair of a gate dielectric layer 100 and a gate electrode 102 may be collectively referred to as a "gate structure" or "gate stack." Each gate structure extends along sidewalls and a top surface of a channel region of a second nanostructure 54. Some of the gate structures also extend along sidewalls and/or a top surface of a fin 66. The gate dielectric layers 100 include one or more gate dielectric layer(s) disposed around the second nanostructures 54 and on the sidewalls of the first spacers 81 and the inner spacers 90. The gate dielectric layers 100 may be formed of an oxide such as silicon oxide or a metal oxide, a silicate such as a metal silicate, combinations thereof, multi-layers thereof, or the like. Additionally or alternatively, the gate dielectric layers 100 may be formed of a high-k dielectric material (e.g., dielectric materials having a k-value greater than about 7.0), such as a metal oxide or a silicate of hafnium, aluminum, zirconium, lanthanum, manganese, barium, titanium, lead, and combinations thereof. The dielectric material(s) of the gate dielectric layers 100 may be formed by molecular-beam deposition (MBD), ALD, PECVD, or the like. Although the gate dielectric layers 100 are illustrated as having a single layer, the gate dielectric layers 100 may include any number of interfacial layers and any number of main layers. For example, the gate dielectric layers 100 may include an interfacial layer and an overlying high-k dielectric layer, in some embodiments.

The gate electrodes 102 include one or more gate electrode layer(s) disposed over the gate dielectric layers 100. The gate electrodes 102 may be formed of a metal-containing material such as titanium nitride, titanium oxide, tantalum nitride, tantalum carbide, tungsten, cobalt, ruthenium, aluminum, combinations thereof, multi-layers thereof, or the like. Although single-layered gate electrodes 102 are illustrated, the gate electrodes 102 may include, for example, any number of work function tuning layers, any number of barrier layers, any number of glue layers, and a fill material.

As an example to form the gate structures, one or more gate dielectric layer(s) may be deposited conformally in the second recesses 98. The gate dielectric layer(s) may be formed on top surfaces and sidewalls of the substrate 50 and on top surfaces, sidewalls, and/or bottom surfaces of the second nanostructures 54. The gate dielectric layer(s) may also be deposited on the top surfaces of the first ILD 96, the CESL 95, and the first spacers 81. Subsequently, one or more gate electrode layer(s) may be deposited on the gate dielectric layer(s), and in the remaining portions of the second recesses 98. A removal process may then be performed to remove the excess portions of the gate dielectric layer(s) and the gate electrode layer(s), which excess portions are over the top surfaces of the first ILD 96, the CESL 95, and the first spacers 81. The gate dielectric layer(s), after the removal process, have portions left in the second recesses 98, thus forming the gate dielectric layers 100. The gate electrode layer(s), after the removal process, have portions left in the second recesses 98, thus forming the gate electrodes 102. In some embodiments, a planarization process such as a CMP, an etch-back process, combinations thereof, or the like is performed. After the planarization process, the top surfaces of the first spacers 81, the CESL 95, the first ILD 96, the gate dielectric layers 100, and the gate electrodes 102 are coplanar (within process variations). The remaining portions of material of the gate electrodes 102 and the gate dielectric layers 100 thus form replacement gate structures of the resulting nano-FETs.

While FIGS. 22A-22C illustrate an embodiment in the p-type region 50P, the formation of the gate dielectric layers 100 in the n-type region 50N and the p-type region 50P may occur simultaneously such that the gate dielectric layers 100 in each region are formed from the same materials, and the formation of the gate electrodes 102 may occur simultaneously such that the gate electrodes 102 in each region are formed from the same materials. In some embodiments, the gate dielectric layers 100 in each region may be formed by distinct processes, such that the gate dielectric layers 100 may be different materials and/or have a different number of layers, and/or the gate electrodes 102 in each region may be formed by distinct processes, such that the gate electrodes 102 may be different materials and/or have a different number of layers. Various masking steps may be used to mask and expose appropriate regions when using distinct processes.

Figure 23C:
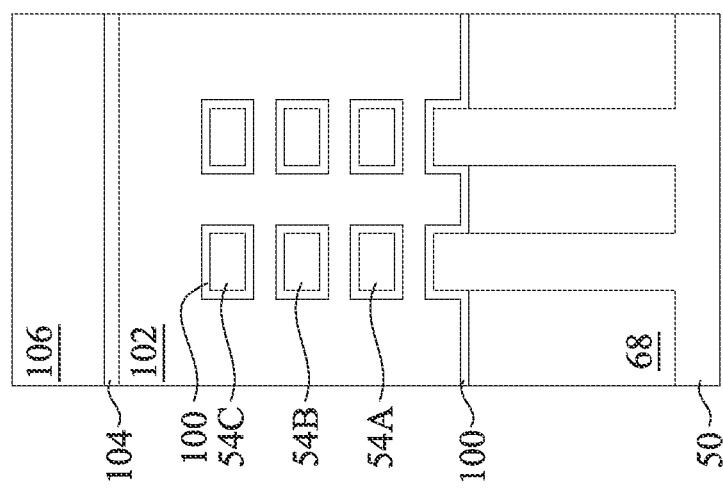

In FIGS. 23A-23C, gate masks 104 and a second ILD 106 are formed over the gate structures, in accordance with some embodiments. The gate structures (e.g., the gate dielectric layers 100 and overlying gate electrodes 102) may be recessed to form a recess (not shown in the figures) over the gate structure and between opposite sidewalls of first spacers 81. One or more layers of dielectric material may then be deposited in the recesses to form the gate masks 104. The dielectric material may be, for example, silicon nitride, silicon oxynitride, or the like. A planarization process may be performed to remove excess portions of the dielectric material extending over the first ILD 96.

The second ILD 106 may be deposited over the first ILD 96 and over the gate masks 104. In some embodiments, the second ILD 106 is a flowable film formed by FCVD. In some embodiments, the second ILD 106 is formed of a dielectric material such as PSG, BSG, BPSG, USG, or the like, which may be deposited by any suitable method, such as CVD, PECVD, or the like.

Figure 24B:
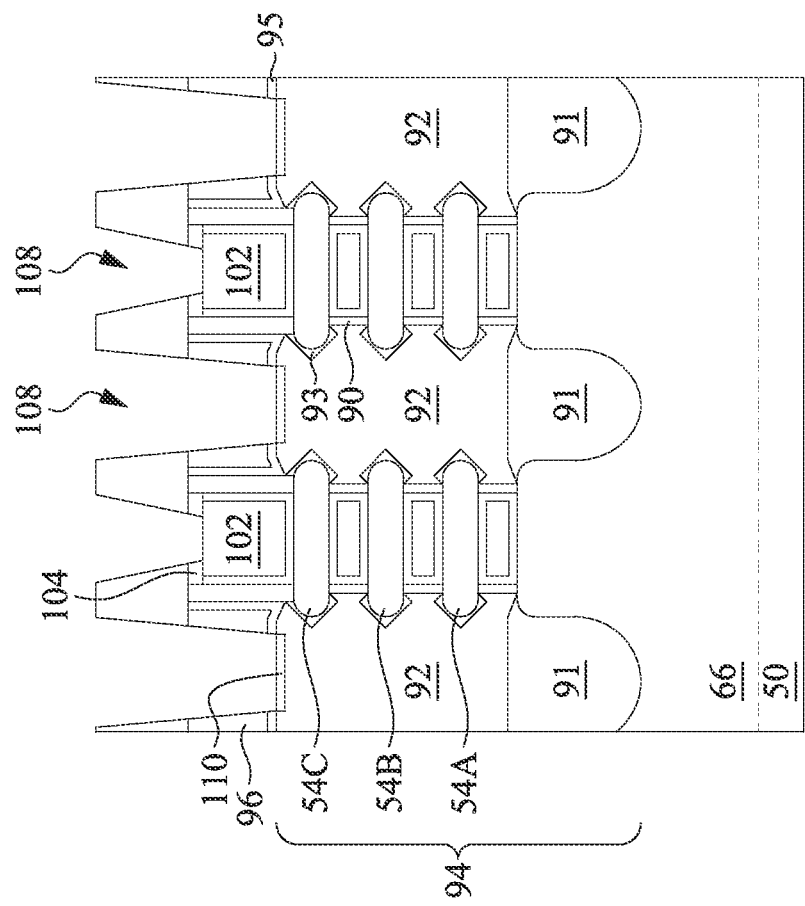
Figure 24A:
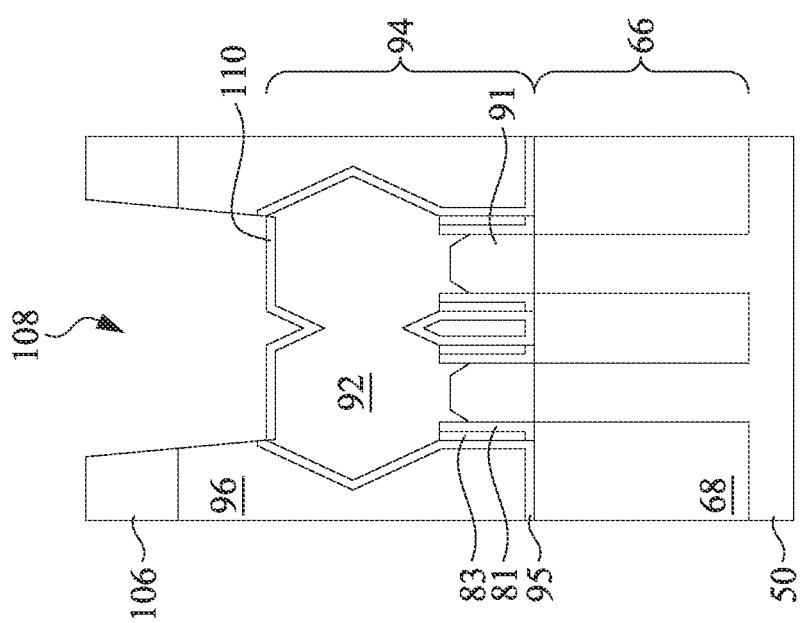
Figure 24C:
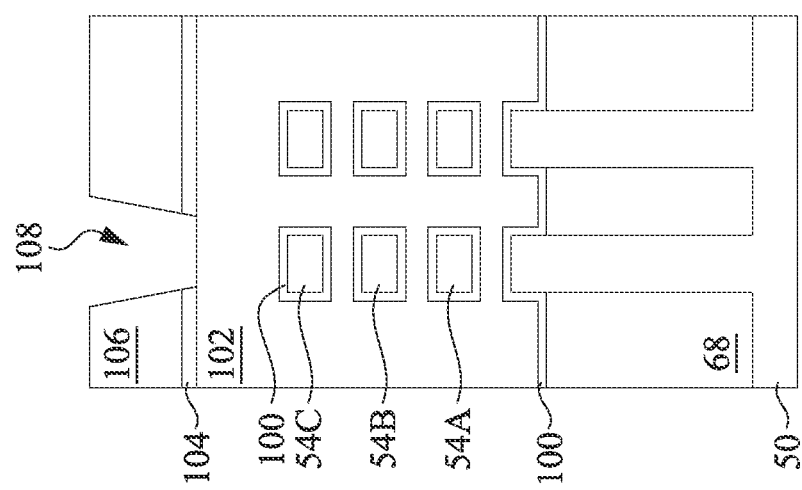

In FIGS. 24A-24C, third recesses 108 are formed that expose surfaces of the epitaxial source/drain regions 94 and/or the gate structures, in accordance with some embodiments. The third recesses 108 may be formed, for example, by etching the second ILD 106, the first ILD 96, the CESL 95, and the gate masks 104 using one or more photolithography and etching steps. In some embodiments, third recesses 108 may be etched through the second ILD 106 and the first ILD 96 using a first etching process, then the third recesses 108 may be extended through the gate masks 104 using a second etching process and the third recesses 108 may be extended through the CESL 95 using a third etching process. A mask, such as a photoresist, may be formed and patterned over the second ILD 106 to mask portions of the second ILD 106 from the first etching process and the second etching process. In some embodiments, the third recesses 108 extend into the epitaxial source/drain regions 94 and/or into the gate structure. The third recesses 108 may be etched, for example, using an anisotropic etching process, such as RIE, NBE, or the like. Although FIG. 24B illustrate the third recesses 108 as exposing the epitaxial source/drain regions 94 and the gate structure in the same cross-section, in various embodiments, the epitaxial source/drain regions 94 and the gate structure may be exposed in different cross-sections.

After forming the third recesses 108, optional silicide regions 110 may be formed over the epitaxial source/drain regions 94, in some embodiments. The silicide regions 110 may be formed, for example, by first depositing a metal (not shown) over the exposed portions of the epitaxial source/drain regions 94, then performing a thermal anneal process to form the silicide regions 110. The metal may include one or more metals suitable for forming silicide or germanide regions, such as nickel, cobalt, titanium, tantalum, platinum, tungsten, other noble metals, other refractory metals, rare earth metals or their alloys, the like, or combinations thereof. The metal may be deposited by a deposition process such as ALD, CVD, PVD, or the like. The un-reacted portions of the deposited metal are then removed, e.g., using an etching process. Although silicide regions 110 are referred to as silicide regions, silicide regions 110 may be germanide regions or silicon germanide regions (e.g., regions comprising silicide and germanide). In an embodiment, the silicide region 110 comprises TiSi, and has a thickness in a range between about 2 nm and about 10 nm, though silicide regions 110 of other compositions or dimensions are possible.

Figure 25B:
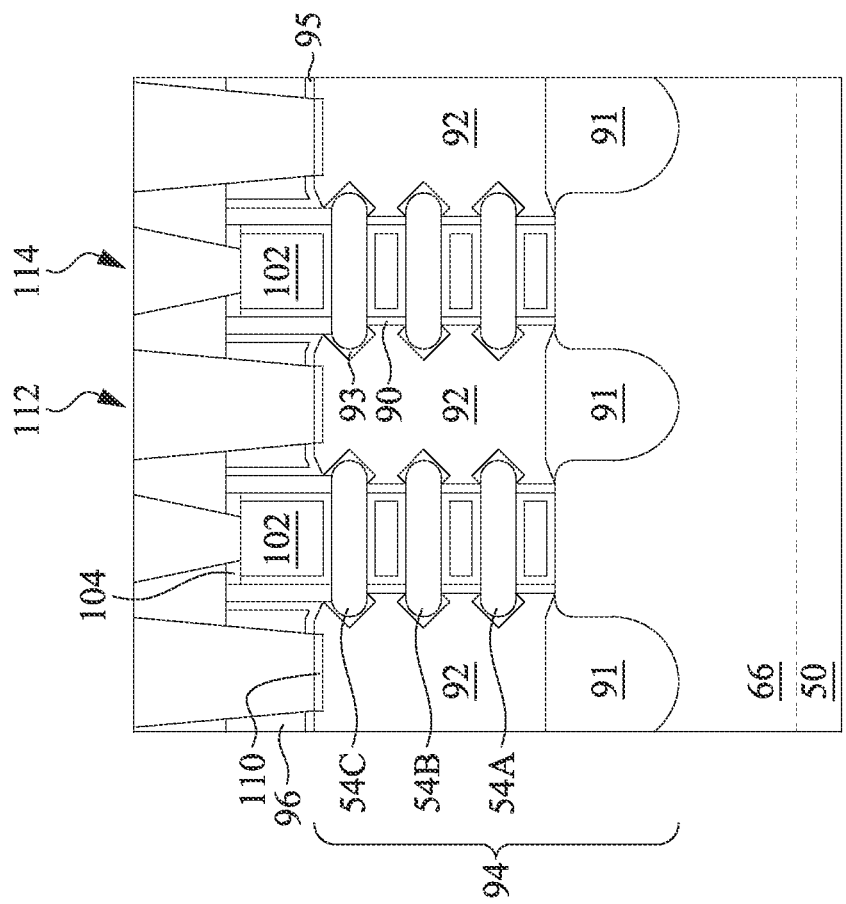
Figure 25A:
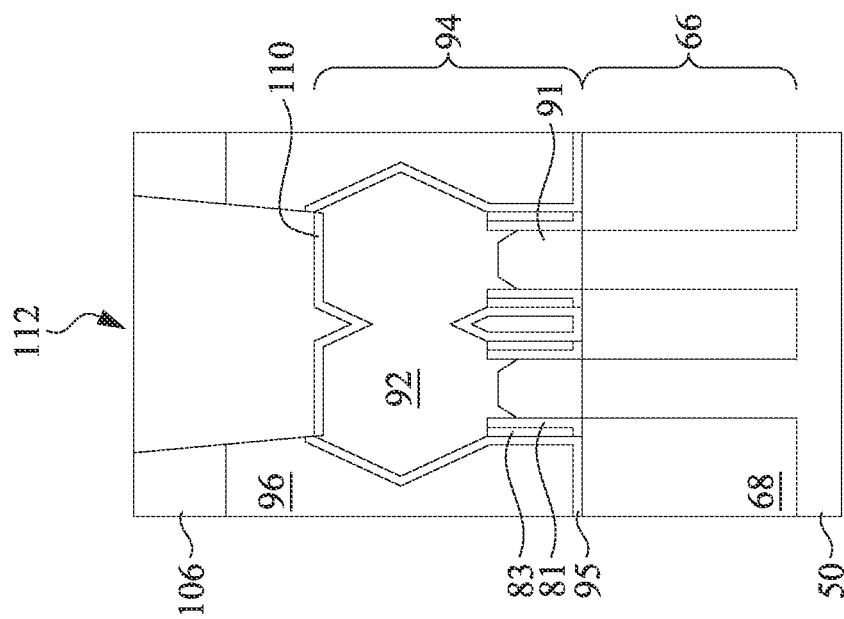

Next, in FIGS. 25A-25C, source/drain contacts 112 and gate contacts 114 are formed to contact, respectively, the epitaxial source/drain regions 94 and the gate electrodes 102. The source/drain contacts 112 are physically and electrically coupled to the silicide regions 110 on the epitaxial source/drain regions 94. The gate contacts 114 are physically and electrically coupled to the gate electrodes 102.

In some embodiments, the source/drain contacts 112 and/or the gate contacts 114 may be formed by depositing a liner (not separately illustrated) in the third recesses 108.

The liner may be, for example, a diffusion barrier layer, an adhesion layer, or the like, and may include titanium, titanium nitride, tantalum, tantalum nitride, the like, or combinations thereof. A conductive material may then be deposited on the liner. The conductive material may be, for example, copper, a copper alloy, silver, gold, tungsten, cobalt, aluminum, nickel, the like, or combinations thereof. A planarization process, such as a CMP, may be performed to remove excess material from the second ILD 106. The remaining liner and conductive material form the gate contacts 114 and the source/drain contacts 112. The gate contacts 114 and the source/drain contacts 112 may be formed in distinct processes, or may be formed in the same process.

Subsequently, the nano-FET devices may be interconnected by metallization layers in an overlying interconnect structure to form integrated circuits. The overlying interconnect structure can be formed in a back-end-of-line (BEOL) process, in which the metallization layers are connected to the gate contacts 114 and the source/drain contacts 112. In some types of devices, such as memory devices, the source/drain contacts 112 to source regions of the devices may be connected to ground. Additional features, such as passive devices, memories (e.g., magnetoresistive random-access memory (MRAM), resistive random access memory (RRAM), phase-change random access memory (PCRAM), etc.), or the like may be integrated with the interconnect structure during the BEOL process.

Embodiments may achieve advantages. For example, by forming epitaxial source/drain regions of p-type nano-FETs that comprise a first epitaxial region and an overlying second epitaxial region, the composition and/or doping concentration of the first epitaxial region may be controlled to reduce leakage and improve device operation. The first epitaxial region may cover surfaces of recesses formed in the semiconductor fins or substantially fill recesses formed in the semiconductor fins. In some cases, the first epitaxial region and the second epitaxial region may be doped with p-type impurities, with the first epitaxial region having a smaller impurity concentration than the second epitaxial region. By forming the first epitaxial region with relatively less doping, leakage due to band-to-band tunneling between the epitaxial source/drain region and the semiconductor fin may be reduced. In some cases, the first epitaxial region may be doped with n-type impurities and the second epitaxial region may be doped with p-type impurities. By forming the first epitaxial region with n-type impurities, leakage due to punch-through may be reduced. In some cases, the first epitaxial region and the second epitaxial region may be silicon germanium, with the first epitaxial region having a smaller atomic fraction of germanium than the second epitaxial region. By forming the first epitaxial region with relatively less germanium, the current carriers may be more confined to the second epitaxial region, which can improve device efficiency.

In an embodiment, a device includes a first nanostructure over a semiconductor substrate; a second nanostructure over the first nanostructure; a gate structure surrounding the first nanostructure and the second nanostructure; a first epitaxial region in the semiconductor substrate adjacent the gate structure, wherein the first epitaxial region is a first doped semiconductor material; and a second epitaxial region over the first epitaxial region, wherein the second epitaxial region is adjacent the first nanostructure and the second nanostructure, wherein the second epitaxial region is a second doped semiconductor material that is different from the first doped semiconductor material. In an embodiment, the first doped semiconductor material has a smaller doping concentration than the second doped semiconductor material. In an embodiment, a top surface of the first epitaxial region extends above a top surface of the semiconductor substrate. In an embodiment, the first doped semiconductor material and the second doped semiconductor material are oppositely doped. In an embodiment, the second doped semiconductor material is doped with p-type impurities. In an embodiment, the first doped semiconductor material is silicon germanium having a first atomic fraction of germanium, and wherein the second doped semiconductor material is silicon germanium having a second atomic fraction of germanium that is greater than the first atomic fraction of germanium. In an embodiment, the first atomic fraction of germanium is less than 0.2. In an embodiment, the device includes sidewall epitaxial regions on sidewalls of the first nanostructure and the second nanostructure, wherein the sidewall epitaxial regions include the first doped semiconductor material.

In an embodiment, a device includes a semiconductor fin protruding from a substrate, the semiconductor fin including a first recess; a first nanostructure over the semiconductor fin; a gate structure surrounding the first nanostructure; and a first source/drain region adjacent the first nanostructure, wherein the first source/drain region includes: a first epitaxial region in the first recess, wherein the first epitaxial region has a first doping concentration; and a second epitaxial region on the first epitaxial region, wherein the second epitaxial region has a second doping concentration that is greater than the first doping concentration. In an embodiment, the first doping concentration is in the range of $1\times10^{17}$ atoms/cm$^3$ to $1\times10^{20}$ atoms/cm$^3$. In an embodiment, the first epitaxial region fills the first recess. In an embodiment, a top surface of the first epitaxial region is at least 3 nm below a bottom surface of the first nanostructure. In an embodiment, the first epitaxial region includes n-type dopants and the second epitaxial region includes p-type dopants. In an embodiment, the first epitaxial region has a gradient doping profile. In an embodiment, the second epitaxial region physically contacts the first nanostructure.

In an embodiment, a method includes forming a set of nanostructures on a substrate, wherein each nanostructure of the set of nanostructures includes a channel region; forming a recess in the substrate adjacent the set of nanostructures; forming a first epitaxial region in the recess using a first epitaxial growth process, wherein the first epitaxial region fills the recess; forming a second epitaxial region on the first epitaxial region using a second epitaxial growth process that is different from the first epitaxial growth process; and forming a gate structure on the set of nanostructures, wherein the gate structure surrounds the channel region of each nanostructure of the set of nanostructures. In an embodiment, the first epitaxial growth process forms sidewall epitaxial regions on sidewalls of the nanostructures of the set of nanostructures. In an embodiment, the method includes performing an etching process to remove the sidewall epitaxial regions. In an embodiment, the sidewall epitaxial regions have facets. In an embodiment, the first epitaxial region has a lower concentration of impurities than the second epitaxial region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a first nanostructure over a semiconductor substrate;
   a second nanostructure over the first nanostructure;
   a gate structure surrounding the first nanostructure and the second nanostructure;
   a first epitaxial region in the semiconductor substrate adjacent the gate structure, wherein the first epitaxial region is a first doped semiconductor material, wherein the first nanostructure overhangs a portion of the first epitaxial region; and
   a second epitaxial region over the first epitaxial region, wherein the second epitaxial region is adjacent the first nanostructure and the second nanostructure, wherein the second epitaxial region is a second doped semiconductor material that is different from the first doped semiconductor material.

2. The device of claim 1, wherein the first doped semiconductor material has a smaller doping concentration than the second doped semiconductor material.

3. The device of claim 1, wherein a top surface of the first epitaxial region extends above a top surface of the semiconductor substrate.

4. The device of claim 1, wherein the first doped semiconductor material and the second doped semiconductor material are oppositely doped.

5. The device of claim 1, wherein the second doped semiconductor material is doped with p-type impurities.

6. The device of claim 1, wherein the first doped semiconductor material is silicon germanium having a first atomic fraction of germanium, and wherein the second doped semiconductor material is silicon germanium having a second atomic fraction of germanium that is greater than the first atomic fraction of germanium.

7. The device of claim 6, wherein the first atomic fraction of germanium is less than 0.2.

8. The device of claim 1 further comprising sidewall epitaxial regions on sidewalls of the first nanostructure and the second nanostructure, wherein the sidewall epitaxial regions comprise the first doped semiconductor material.

9. A device comprising:
   a semiconductor fin protruding from a substrate, the semiconductor fin comprising a first recess;
   a first nanostructure over the semiconductor fin;
   a gate structure surrounding the first nanostructure; and
   a first source/drain region adjacent the first nanostructure, wherein the first source/drain region comprises:
   a first epitaxial region in the first recess, wherein the first epitaxial region has a first doping concentration, wherein the first epitaxial region fills the first recess; and
   a second epitaxial region on the first epitaxial region, wherein the second epitaxial region has a second doping concentration that is greater than the first doping concentration.

10. The device of claim 9, wherein the first doping concentration is in the range of $1 \times 10^{17}$ atoms/cm$^3$ to $1 \times 10^{20}$ atoms/cm$^3$.

11. The device of claim 9, wherein a top surface of the first epitaxial region is at least 3 nm below a bottom surface of the first nanostructure.

12. The device of claim 9, wherein the first epitaxial region comprises n-type dopants and the second epitaxial region comprises p-type dopants.

13. The device of claim 9, wherein the first epitaxial region has a gradient doping profile.

14. The device of claim 9, wherein the second epitaxial region physically contacts the first nanostructure.

15. The device of claim 9, wherein the first nanostructure protrudes into the second epitaxial region.

16. A device comprising:
   a set of nanostructures on a substrate, wherein each nanostructure of the set of nanostructures comprises a channel region;
   a first epitaxial region in the substrate adjacent the set of nanostructures, wherein the first epitaxial region has a first composition;
   second epitaxial regions on respective sidewalls of respective nanostructures, wherein the second epitaxial regions have the first composition;
   a third epitaxial region on the first epitaxial region and on the second epitaxial regions, wherein the third epitaxial region has a second composition that is different than the first composition, wherein the first composition and the second composition are oppositely doped; and
   a gate structure on the set of nanostructures, wherein the gate structure surrounds the channel region of each nanostructure of the set of nanostructures.

17. The device of claim 16, wherein the first composition has a smaller doping concentration than the second composition.

18. The device of claim 16, wherein the first composition comprises n-type dopants and the second composition comprises p-type dopants.

19. The device of claim 16, wherein the second epitaxial regions have facets.

20. The device of claim 16, wherein the first composition and the second composition comprise silicon germanium.

* * * * *